(12) United States Patent
Seo et al.

(10) Patent No.: US 11,133,342 B2
(45) Date of Patent: Sep. 28, 2021

(54) IMAGE SENSOR

(71) Applicant: Samsung Electronics Co., Ltd., Suwon-si (KR)

(72) Inventors: Jae-Kwan Seo, Hwaseong-si (KR); Jaihoon Kang, Hwaseong-si (KR); Boram Kim, Suwon-si (KR); Jinsu Park, Suwon-si (KR); Seul-Young Jeong, Hwaseong-si (KR); Sunwook Heo, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/583,788

(22) Filed: Sep. 26, 2019

(65) Prior Publication Data

US 2020/0258928 A1    Aug. 13, 2020

(30) Foreign Application Priority Data

Feb. 13, 2019    (KR) .................. 10-2019-0016849

(51) Int. Cl.
  *H01L 27/146*    (2006.01)
(52) U.S. Cl.
  CPC .. *H01L 27/14621* (2013.01); *H01L 27/14627* (2013.01); *H01L 27/14645* (2013.01)
(58) Field of Classification Search
  CPC ......... H01L 27/14621; H01L 27/14627; H01L 27/14645
  USPC ...................................................... 257/294
  See application file for complete search history.

(56) References Cited

U.S. PATENT DOCUMENTS

| 7,502,058 B2 | 3/2009 | Hiatt et al. |
| 8,669,134 B2 | 3/2014 | Ito et al. |
| 8,742,525 B2 | 6/2014 | Ogita et al. |
| 8,766,386 B2 | 7/2014 | Tsuji |
| 9,640,576 B2 | 5/2017 | Wu et al. |
| 9,780,139 B2 | 10/2017 | Tayanaka et al. |
| 2012/0075509 A1* | 3/2012 | Ito ................... H01L 27/14621 348/265 |
| 2012/0147208 A1* | 6/2012 | Otsuka ............. H01L 27/14623 348/222.1 |
| 2012/0217602 A1* | 8/2012 | Enomoto ............... H04N 5/374 257/432 |
| 2012/0267745 A1* | 10/2012 | Tsuji ................ H01L 27/14627 257/432 |
| 2016/0276396 A1* | 9/2016 | Tayanaka .......... H01L 27/14607 |
| 2018/0261639 A1 | 9/2018 | Takahashi et al. |
| 2019/0214419 A9* | 7/2019 | Tayanaka .......... H01L 27/14627 |
| 2019/0319060 A1* | 10/2019 | Do .................... H01L 27/14621 |

FOREIGN PATENT DOCUMENTS

| KR | 10-0529671 B1 | 11/2005 |
| KR | 10-2010-0078370 A | 7/2010 |

* cited by examiner

*Primary Examiner* — Dzung Tran
(74) *Attorney, Agent, or Firm* — Myers Bigel, P.A.

(57) ABSTRACT

An image sensor includes a substrate having a plurality of pixel regions, a lower layer on the substrate; a plurality of color filters on the lower layer, and a micro-lens layer on or covering top surfaces of the color filters. The micro-lens layer extends to a location between two of the color filters and contacts the lower layer on one of the pixel regions. The color filters are spaced apart from the lower layer.

18 Claims, 27 Drawing Sheets

IMAGE SENSOR

CROSS-REFERENCE TO RELATED APPLICATION

This U.S. nonprovisional application claims priority under 35 U.S.C § 119 to Korean Patent Application No. 10-2019-0016849 filed on Feb. 13, 2019 in the Korean Intellectual Property Office, the entire contents of which are hereby incorporated by reference.

FIELD

The present inventive concepts relate to an image sensor, and more particularly, to a color filter and a micro-lens layer of an image sensor.

BACKGROUND

An image sensor is a semiconductor device that can convert optical images into electrical signals. Image sensors can be classified as charge coupled device (CCD)-type image sensors or complementary metal oxide semiconductor (CMOS)-type image sensors. A CIS (CMOS image sensor) refers to the CMOS type image sensor. The CIS may have a plurality of two-dimensionally arranged pixels. Each of the pixels may include a photodiode (PD). The photodiode serves to transform or convert incident light into an electrical signal.

SUMMARY

Some example embodiments of the present inventive concepts provide an image sensor with improved image properties.

Some example embodiments of the present inventive concept provide a simplified method of fabricating an image sensor.

According to some example embodiments of the present inventive concepts, an image sensor may include a substrate having a plurality of pixel regions; a lower layer on the substrate; a plurality of color filters on the lower layer; and a micro-lens layer on or covering top surfaces of the color filters. The micro-lens layer may extend to a location between two of the color filters and may contact the lower layer on one of the pixel regions. The color filters may be spaced apart from the lower layer.

According to some example embodiments of the present inventive concepts, an image sensor may include a substrate; a first color filter on a first pixel region of the substrate; a first adhesive pattern between the substrate and the first color filter; a second color filter on a second pixel region of the substrate and laterally spaced apart from the first color filter on the first pixel region; and a micro-lens layer including a gap-fill portion and covering a top surface of the first color filter and a top surface of the second color filter. The gap-fill portion may be provided between a lateral surface of the first color filter and a lateral surface of the second color filter on a third pixel region of the substrate. The first adhesive pattern may not be provided between the substrate and a bottom surface of the gap-fill portion on the third pixel region.

According to some example embodiments of the present inventive concepts, an image sensor may include a substrate having first, second, and third pixel regions; an adhesive layer on the substrate; a first color filter on the adhesive layer on the first pixel region; a second color filter on the adhesive layer on the second pixel region and laterally spaced apart from the first color filter on the first pixel region; and a micro-lens layer including a gap-fill portion and on or covering a top surface of the first color filter and a top surface of the second color filter. The gap-fill portion may contact the adhesive layer on the third pixel region and may be provided between a lateral surface of the first color filter and a lateral surface of the second color filter.

BRIEF DESCRIPTION OF THE DRAWINGS

FIGS. 2A to 2M illustrate cross-sectional views showing a method of fabricating an image sensor according to some example embodiments.

DETAILED DESCRIPTION OF EMBODIMENTS

Figure 1A:
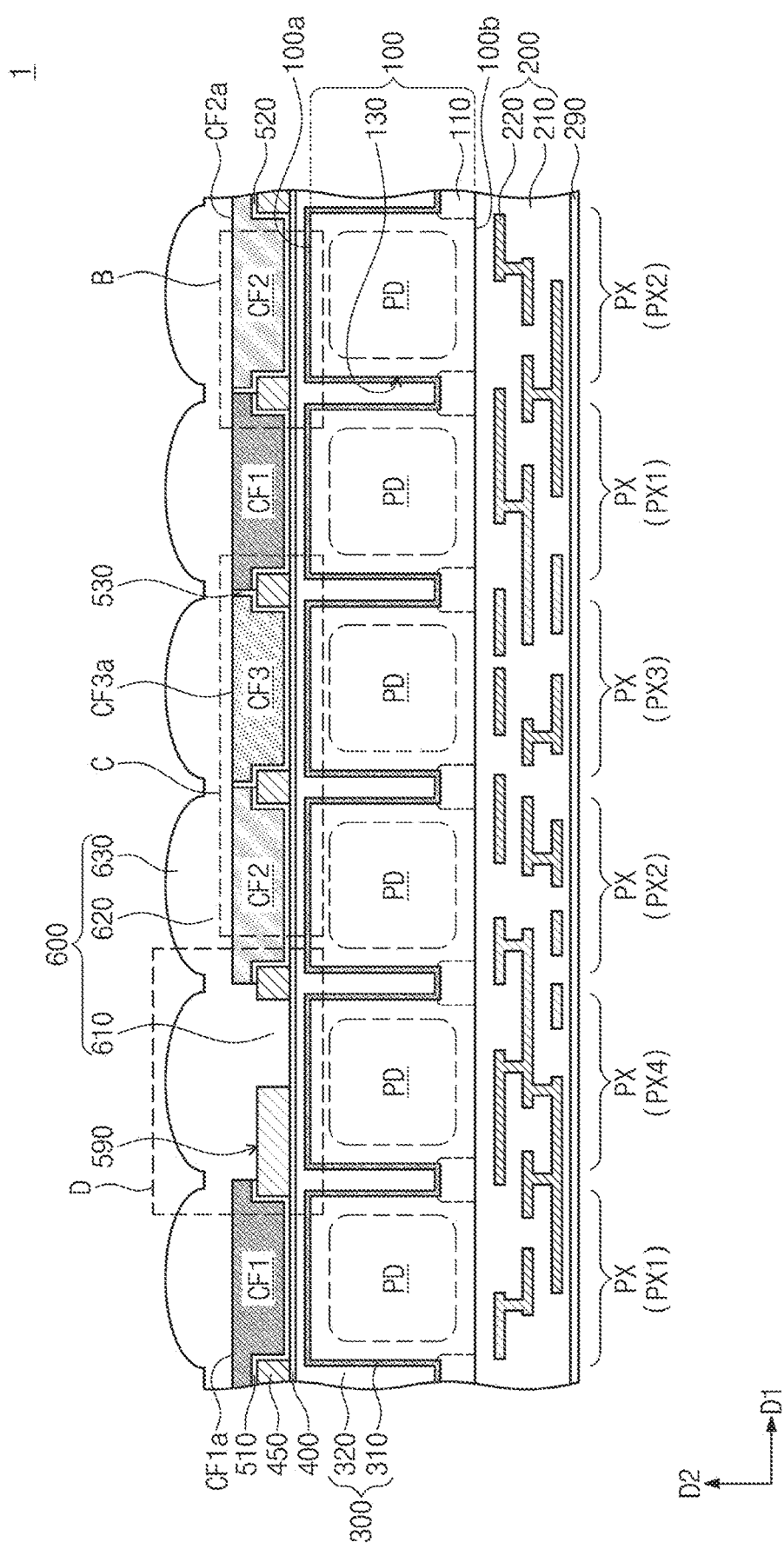
FIG. 1A illustrates a cross-sectional view showing an image sensor according to some example embodiments.

Like reference numerals may indicate like components throughout the description. The following will now describe an image sensor and a method of fabricating the same according to the present inventive concepts.

Figure 1B:
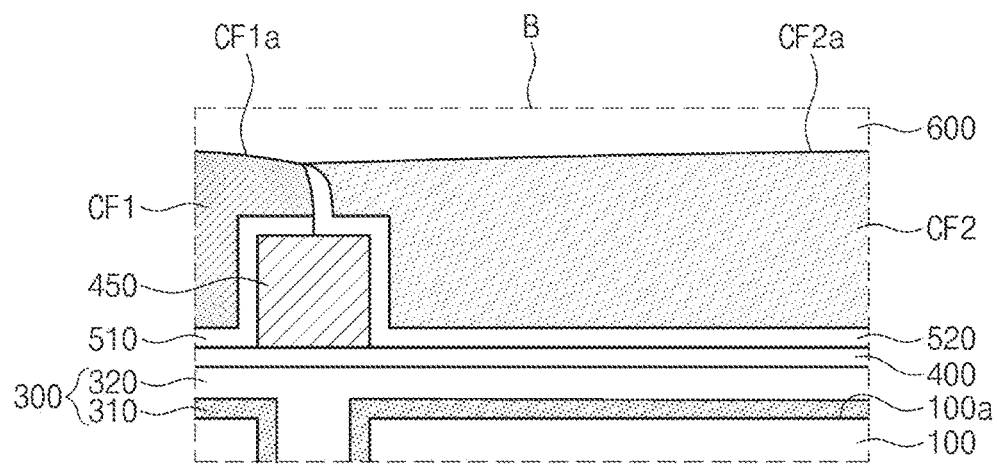
FIG. 1B illustrates an enlarged view showing section B of FIG. 1A.
Figure 1C:
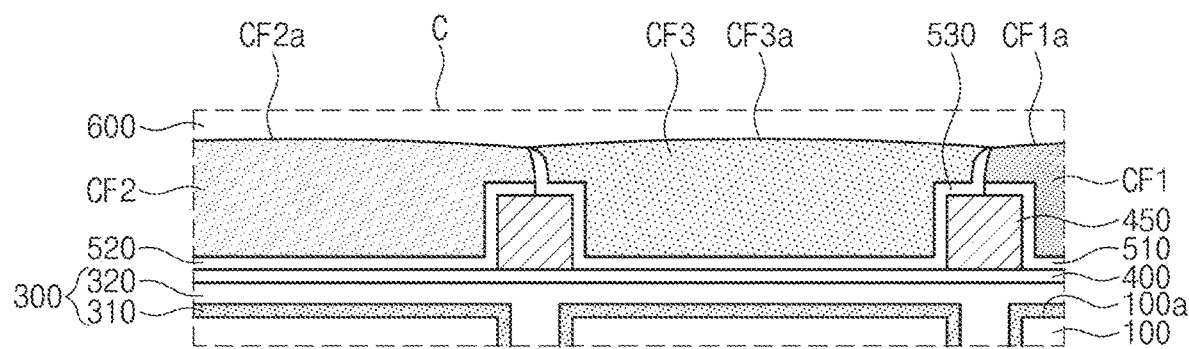
FIG. 1C illustrates an enlarged view showing section C of FIG. 1A.
Figure 1D:
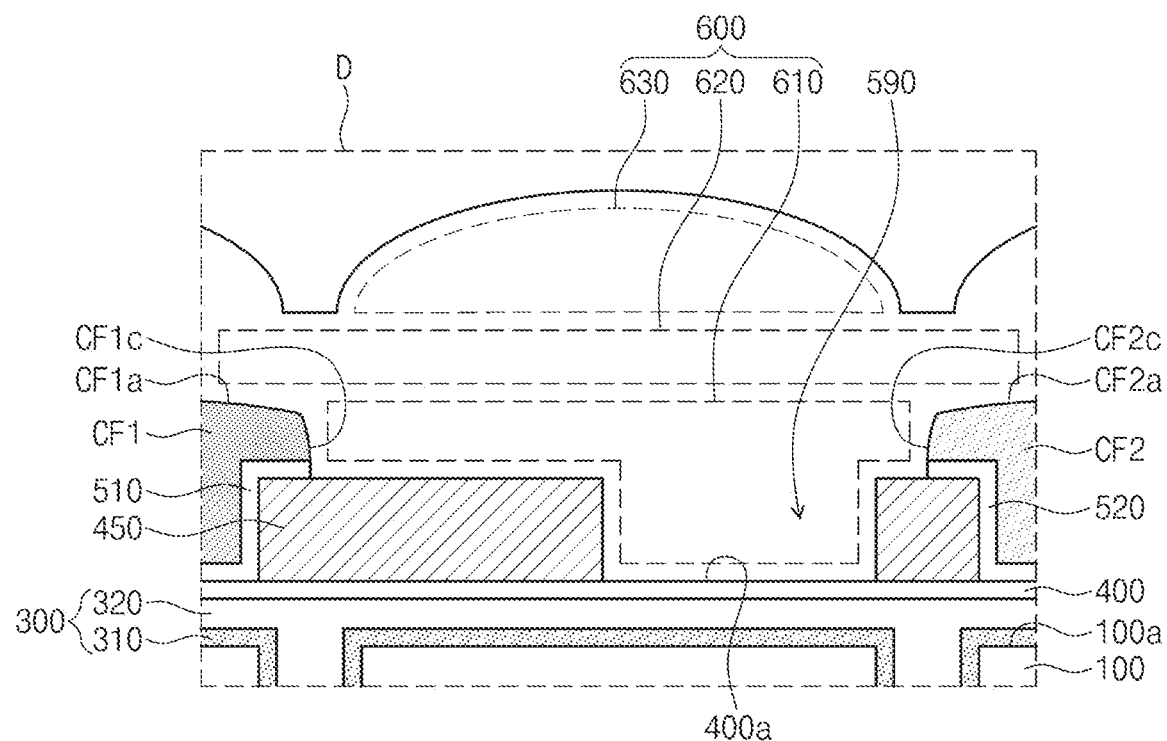
FIG. 1D illustrates an enlarged view showing section D of FIG. 1A.

FIG. 1A illustrates a cross-sectional view showing an image sensor according to some example embodiments. FIG. 1B illustrates an enlarged view showing section B of FIG. 1A. FIG. 1C illustrates an enlarged view showing section C of FIG. 1A. FIG. 1D illustrates an enlarged view showing section D of FIG. 1A.

Referring to FIGS. 1A to 1D, an image sensor 1 may include a substrate 100, a connection line layer 200, a device isolation pattern 300, an adhesive layer 400, a light-shielding pattern 450, first, second, and third adhesive patterns 510, 520, and 530, color filters CF1, CF2, and CF3, and a micro-lens layer 600. The substrate 100 of the image sensor 1 may have a first surface 100a and a second surface 100b opposite each other. The first surface 100a may be a rear surface of the substrate 100, and the second surface 100b may be a front surface of the substrate 100. The substrate 100 may receive light through the first surface 100a thereof. The image sensor 1 may be a backside illumination image sensor. A first direction D1 may be parallel to the second surface 100b of the substrate 100, and a second direction D2 may be perpendicular to the second surface 100b of the substrate 100. In plan view, the substrate 100 may have pixel regions PX. Each pixel region PX may output photoelectric signals, which photoelectric signals may be originated from or generated responsive to light incident into the each pixel region PX. The pixel regions PX may include a first pixel region PX1, a second pixel region PX2, a third pixel region PX3, and a fourth pixel region PX4.

The substrate 100 may be, for example, a silicon substrate or a silicon-on-insulator (SOI) substrate. The substrate 100 may be doped with impurities of a first conductivity type (also referred to herein as a first conductive type). The impurities of the first conductive type may include, for example, p-type impurities, such as aluminum (Al), boron (B), indium (In), and gallium (Ga).

Photoelectric conversion parts or regions PD may be provided in the pixel regions PX of the substrate 100. The photoelectric conversion parts PD may include, for example, a photoelectric conversion part PD in the first pixel region PX1, a photoelectric conversion part PD in the second pixel region PX2, a photoelectric conversion part PD in the third pixel region PX3, and a photoelectric conversion part PD in the fourth pixel region PX4. The photoelectric conversion parts PD may be regions doped with impurities of a second conductivity type (also referred to herein as a second conductive type). The second conductive type may be different from the first conductive type. For example, the impurities of the second conductive type may include n-type impurities, such as arsenic, bismuth, and antimony. The photoelectric conversion parts PD may be doped to have a different conductive type from those of the substrate 100, which may result in PN-junctions that define photodiodes. The photoelectric conversion parts PD may generate electron-hole pairs from or responsive to light incident through the first surface 100a of the substrate 100.

Although not shown, the substrate 100 may have transistors disposed on the second surface 100b. The transistors may include, for example, transfer transistors, reset transistors, select transistors, and source follower transistors. The transistors may transfer electron-hole pairs formed in the photoelectric conversion parts PD and generate electrical signals.

The substrate 100 may be provided therein with a device isolation region 110 adjacent to the second surface 100b The device isolation region 110 may be a region doped with impurities of the first conductive type. An impurity concentration of the first conductive type may be higher in the device isolation region 110 than in the substrate 100. The device isolation region 110 may define active regions of the above-mentioned transistors (e.g., the transfer transistors, the reset transistors, the select transistors, and the source follower transistors).

The connection line layer 200 may be disposed on the second surface 100b of the substrate 100. The connection line layer 200 may include an interlayer dielectric layer 210 and connection line structures 220. The interlayer dielectric layer 210 may cover the second surface 100b of the substrate 100. The interlayer dielectric layer 210 may be formed as a single layer or multiple layers. The interlayer dielectric layer 210 may include one or more of a silicon oxide layer, a silicon nitride layer, a silicon oxynitride layer, and a porous low-k dielectric layer. The connection line structures 220 may be provided in the interlayer dielectric layer 210. The connection line structures 220 may include connection line patterns and via patterns. The connection line structures 220 may be electrically connected to the transistors on the second surface 100b of the substrate 100.

A passivation layer 290 may further be provided on a bottom surface of the connection line layer 200. The passivation layer 290 may be formed of, for example, silicon nitride or polyimide.

The device isolation pattern 300 may be provided in the substrate 100 and on the first surface 100a of the substrate 100, separating and defining the pixel regions PX. The device isolation pattern 300 may be a deep trench isolation layer. The device isolation pattern 300 may be provided in a trench 130 that is recessed from the first surface 100a of the substrate 100. The trench 130 may be provided between the pixel regions PX in the substrate 100. The device isolation pattern 300 may physically and electrically separate the pixel regions PX of the substrate 100 from each other. For example, the device isolation pattern 300 may electrically separate the photoelectric conversion parts PD from each other. The device isolation pattern 300 may have a refractive index less than that of the substrate 100. In plan view, the device isolation pattern 300 may overlap at least a portion of the device isolation region 110. For example, the device isolation pattern 300 may have a bottom surface provided in the device isolation region 110.

The device isolation pattern 300 may include a fixed charge layer 310 and a buried dielectric layer 320. The fixed charge layer 310 may be provided in the trench 130 and on the first surface 100a of the substrate 100, and may conformally extend on or cover the first surface 100a of the substrate 100 and an inner wall of the trench 130. The fixed charge layer 310 may contact the substrate 100, e.g., with or without intervening elements therebetween. The fixed charge layer 310 may include a metal oxide layer and a metal fluoride layer, which metal may include one or more of hafnium (Hf), zirconium (Zr), aluminum (Al), tantalum (Ta), titanium (Ti), yttrium (Y), and lanthanide. The metal oxide layer or the metal fluoride layer may include oxygen or fluoride whose amount is less than its stoichiometric ratio. For example, the fixed charge layer 310 may include one or more of aluminum oxide and hafnium oxide. Hole accumulation may occur around the fixed charge layer 310. The fixed charge layer 310 may reduce the occurrence of dark current and white spots.

The fixed charge layer 310 may be provided on the inner walls of the trench 130 with the buried dielectric layer 320 filling the trench 130. The buried dielectric layer 320 may extend on or cover the fixed charge layer 310 on the first surface 100a of the substrate 100. The buried dielectric layer 320 may include a silicon oxide-based material.

The adhesive layer 400 may be disposed on the first surface 100a of the substrate 100, on or covering the device isolation pattern 300. For example, the adhesive layer 400 may cover a top surface of the buried dielectric layer 320. The adhesive layer 400 may include metal oxide. For example, the adhesive layer 400 may include aluminum oxide. The adhesive layer 400 may be a lower layer. As used herein, spatially relative terms such as "upper," "top," "lower," "bottom," and the like, may be used to differentiate one layer or surface from another, and are intended to encompass different orientations of the device in use or operation in addition to the orientation depicted in the figures.

The light-shielding pattern 450 may be provided on the adhesive layer 400. The light-shielding pattern 450 may vertically overlap the trench 130. The phrase "two components vertically overlap each other" may mean that one of the two components is disposed either in the second direction D2 or in an opposite direction to the second direction D2 from the other of the two components, e.g., such that portions thereof are overlapping along the second direction D2. The light-shielding pattern 450 may not vertically overlap the photoelectric conversion parts PD in the first, second, and third pixel regions PX1, PX2, and PX3. In some embodiments, the light-shielding pattern 450 on the fourth pixel region PX4 may extend onto the photoelectric conversion part PD, and a portion of the light-shielding pattern 450 may vertically overlap the photoelectric conversion part PD on the fourth pixel region PX4. In other embodiments, the light-shielding pattern 450 may not vertically overlap the photoelectric conversion part PD on the fourth pixel region PX4. The light-shielding pattern 450 may include metal, such as tungsten. A barrier pattern may further be provided between the adhesive layer 400 and the light-shielding pattern 450. The barrier pattern may include, for example, a silicon nitride layer.

The color filters CF1, CF2, and CF3 may be disposed on the adhesive layer 400. The color filters CF1, CF2, and CF3 may be disposed on corresponding pixel regions PX of the substrate 100. The color filters CF1, CF2, and CF3 may be arranged side-by-side and laterally spaced apart from each other. For example, the color filters CF1, CF2, and CF3 may be spaced apart from each other in the first direction D1 or in an opposite direction to the first direction D1. The color filters CF1, CF2, and CF3 may include a first color filter CF1, a second color filter CF2, and a third color filter CF3. The first color filter CF1 may be provided on the first pixel region PX1 of the substrate 100. The first color filter CF1 may be transparent to first wavelength light. The photoelectric conversion part PD in the first pixel region PX1 may generate charges from or responsive to the first wavelength light. The first wavelength light may be one of green-, blue-, or red-colored light, that is, light having a wavelength corresponding to the green, blue, or red portions of the visible spectrum.

The second color filter CF2 may be provided on the second pixel region PX2 of the substrate 100. The second color filter CF2 may be laterally spaced apart from the first color filter CF1. The second color filter CF2 may be transparent to second wavelength light. The second wavelength light may be different from the first wavelength light. The second wavelength light may be another of the green-, blue-, or red-colored light. The photoelectric conversion part PD on the second pixel region PX2 may generate charges from or responsive to the second wavelength light.

The third color filter CF3 may be provided on the third pixel region PX3 of the substrate 100. The third color filter CF3 may be laterally spaced apart from the first color filter CF1 and the second color filter CF2. The third color filter CF3 may be transparent to third wavelength light different from the first wavelength light and the second wavelength light. For example, the third wavelength light may be the remainder or the remaining one of the green-, blue- or red-colored light. The photoelectric conversion part PD on the third pixel region PX3 may generate charges from or responsive to the third wavelength light.

The first color filter CF1 may be one of green, blue, or red filters, the second color filter CF2 may be another of the green, blue, or red filters, and the third color filter CF3 may be the remainder or remaining one of the green, blue, or red filters. However, the colors of the light passing through the color filters CF1, CF2, and CF3 are not limited thereto, and may be variously changed in accordance with some embodiments.

The first adhesive pattern 510 may be interposed between the adhesive layer 400 and the first color filter CF1. The first adhesive pattern 510 may separate the first color filter CF1 from the adhesive layer 400. The first adhesive pattern 510 may further extend to a location between the first color filter CF1 and the light-shielding pattern 450. The first adhesive pattern 510 may be spaced apart from the second color filter CF2 and the third color filter CF3, as shown in FIGS. 1B and 1C. The first adhesive pattern 510 may include an organic material, such as polymer. For example, the first adhesive pattern 510 may include an acryl-based polymer. The first adhesive pattern 510 may attach the first color filter CF1 to the adhesive layer 400. The first adhesive pattern 510 may be transparent. In this description, the phrase "be transparent" (without qualification with respect to a particular wavelength or color of light) may mean "be transparent to visible light." For example, the phrase "be transparent" may indicate "have transmittance of 90% or higher to light in the visible light range." The first adhesive pattern 510 may have a thickness of about 6 Å to about 100 Å. When the first adhesive pattern 510 has a thickness of less than about 6 Å, the first adhesive pattern 510 may decrease in adhesiveness. When the first adhesive pattern 510 has a thickness of greater than about 100 Å, the first adhesive pattern 510 may reduce image properties of light passing therethrough.

The second adhesive pattern 520 may be interposed between the adhesive layer 400 and the second color filter CF2. The second adhesive pattern 520 may separate the second color filter CF2 from the adhesive layer 400. As shown in FIG. 1B, the second adhesive pattern 520 may be disposed between the second color filter CF2 and the light-shielding pattern 450 and may be on or covering a sidewall of the light-shielding pattern 450 and a portion of a top surface of the light-shielding pattern 450. When the first and second pixel regions PX1 and PX2 neighbor each other, the second adhesive pattern 520 may further extend to a location between corresponding second and first color filters CF2 and CF1. The second adhesive pattern 520 may contact the first color filter CF1. The second color filter CF2 may be spaced apart from the first color filter CF1, without directly contacting the first color filter CF1. As shown in FIG. 1C, although the second pixel region PX2 neighbors the third pixel region PX3, the second adhesive pattern 520 may not separate or extend to a location between the second and third color filters CF2 and CF3. The second adhesive pattern 520 may be spaced apart from the third color filter CF3, for example, by a portion of the third adhesive pattern 530. The second adhesive pattern 520 may include an organic material, such as acryl-based polymer. The second adhesive pattern 520 may attach the second color filter CF2 to the adhesive layer 400. The second adhesive pattern 520 may have a thickness of about 6 Å to about 100 Å, and thus may exhibit enhanced adhesiveness and improved transmittance. The second adhesive pattern 520 may be transparent.

The third adhesive pattern 530 may be interposed between the adhesive layer 400 and the third color filter CF3. The third adhesive pattern 530 may separate the third color filter CF3 from the adhesive layer 400. The third adhesive pattern 530 may be interposed between the third color filter CF3 and the light-shielding pattern 450. The third adhesive pattern 530 may attach the third color filter CF3 to the adhesive layer 400 and the light-shielding pattern 450. The third adhesive pattern 530 may include an organic material, such as acryl-based polymer. The third adhesive pattern 530 may be transparent. As shown in FIG. 1C, the third adhesive pattern 530 may extend to a location between neighboring second and third color filters CF2 and CF3, contacting the second color filter CF2. The third adhesive pattern 530 may separate the third color filter CF3 from the second color filter CF2. The third adhesive pattern 530 may extend to a location between the first and third color filters CF1 and CF3, contacting the first color filter CF1. The third adhesive pattern 530 may separate the third color filter CF3 from the first color filter CF1. The third adhesive pattern 530 may have a thickness of about 6 Å to about 100 Å.

The first, second, and third adhesive patterns 510, 520, and 530 may include no (i.e., may be free of) inorganic material. The inorganic material may include a silicon-based material. When the adhesive patterns 510, 520, and 530 include an inorganic material, properties of the adhesive patterns 510, 520, and 530 may be reduced due to reaction between the inorganic material and an acryl-based polymer.

None of the first, second, and third color filters CF1, CF2, and CF3 may be provided on the fourth pixel region PX4. None of the first, second, and third adhesive patterns 510, 520, and 530 may be provided on the adhesive layer 400 on the fourth pixel region PX4. A gap 590 may be provided between opposing sidewall or lateral surfaces of any adjacent two of the color filters CF1, CF2, and CF3. For example, as shown in FIG. 1D, the gap 590 may be provided between the first and second color filters CF1 and CF2. The gap 590 may expose a top surface 400a of the adhesive layer 400, a sidewall or lateral surface CF1c of the first color filter CF1, and a sidewall or lateral surface CF2c of the second color filter CF2. The gap 590 may further expose the light-shielding pattern 450. In other embodiments, the gap 590 may be provided between the first and third color filters CF1 and CF3 or between the second and third color filters CF2 and CF3.

The micro-lens layer 600 may be disposed on top surfaces CF1a, CF2a, and CF3a of the first, second, and third color filters CF1, CF2, and CF3. The micro-lens layer 600 may include a photoresist material or a thermosetting resin. The micro-lens layer 600 may have a gap-fill portion 610, a planarized portion 620, and a plurality of lens portions 630.

The gap-fill portion 610 may be provided in the gap 590 between the first and second color filters CF1 and CF2. As shown in FIG. 1D, the gap-fill portion 610 may directly contact the lateral surface CF1c of the first color filter CF1, the lateral surface CF2c of the second color filter CF2, and the top surface 400a of the adhesive layer 400. As used herein, when an element or region is "directly on" or "directly contacts" another element or region, no intervening elements are present. As illustrated in FIG. 1A, the gap-fill portion 610 may be provided on the photoelectric conversion part PD of the fourth pixel region PX4 of the substrate 100, and in plan view, may overlap the photoelectric conversion part PD of the fourth pixel region PX4. The micro-lens layer 600 may be transparent to light in the visible light range. For example, the micro-lens layer 600 may have a transmittance of about 90% or higher to light in the visible light range. The light in the visible light range may have a wavelength of about 380 nm to about 770 nm. Therefore, the gap-fill portion 610 of the micro-lens layer 600 may serve as a white color filter. The light in the visible light range may pass through the gap-fill portion 610 and then travel into the photoelectric conversion part PD of the fourth pixel region PX4. The photoelectric conversion part PD of the fourth pixel region PX4 may output photoelectric signals corresponding to the light in the visible light range. The gap-fill portion 610 may have therein no defects, such as voids. Thus, it may be possible to improve reliability of photoelectric signals that are output from the photoelectric conversion part PD of the fourth pixel region PX4.

The fourth pixel region PX4 may be a focus detection pixel. The focus detection pixel may serve to correct focuses of images that are output from the pixel regions PX, but may not serve to output images of capturing-target objects. For example, the photoelectric conversion parts PD may be spaced apart from each other in plan view, and light incident onto the photoelectric conversion parts PD may have different phases from each other. A phase difference between images obtained in the photoelectric conversion parts PD may be compared to correct a focus of the obtained image. For example, a photoelectric signal that is output from the fourth pixel region PX4 and a photoelectric signal that is output from the first pixel region PX1 may be compared with each other to correct a focus of an image that is output from the first pixel region PX1. Likewise, it may be possible to correct focuses of images that are output from the second and third pixel regions PX2 and PX3. Therefore, the image sensor 1 may obtain three-dimensional depth information about capturing target objects.

The planarized portion 620 of the micro-lens layer 600 may be provided on the gap-fill portion 610 and on the top surfaces CF1a, CF2a, and CF3a of the first, second, and third color filters CF1, CF2, and CF3. The planarized portion 620 may be integrally formed with and connected, without boundaries, to the gap-fill portion 610 and the lens portions 630. The planarized portion 620 may include the same material as that of the gap-fill portion 610 and the lens portions 630.

The lens portions 630 may be correspondingly provided on the first, second, third, and fourth pixel regions PX1, PX2, PX3, and PX4 of the substrate 100. In plan view, the lens portions 630 may correspondingly overlap the first color filter CF1, the second color filter CF2, the third color filter CF3, and the gap-fill portion 610. For example, the lens portions 630 may include a lens portion 630 overlapping the first color filter CF1, a lens portion 630 overlapping the second color filter CF2, a lens portion 630 overlapping the third color filter CF3, and a lens portion 630 overlapping the gap-fill portion 610. Each of the lens portions 630 may have a hemispheric or hemi-ellipsoid shape.

In some embodiments, the micro-lens layer 600 may include the gap-fill portion 610, and as a result, it may not be necessary to form a fourth color filter. The fourth color filter may be a white color filter. Therefore, the fabrication of the image sensor 1 may become simplified.

When a fourth color filter is provided in the gap 590 between the first and second color filters CF1 and CF2, a difference in level or non-coplanarity may be produced between a top surface of the fourth color filter and one or more of the top surfaces CF1a, CF2a, and CF3a of the color filters CF1, CF2, and CF3. In this case, striation defects (e.g., in the micro-lens layer 600) may occur to reduce image properties of the image sensor 1. In some embodiments, because no fourth color is provided and the micro-lens layer 600 includes the gap-fill portion 610, the image sensor 1 may exhibit improved image properties.

In some embodiments, the first color filter CF1 may be provided in plural, and the plurality of first color filters CF1 may have their top surfaces CF1a at the same or similar level. Likewise, a plurality of second color filters CF2 may have their top surfaces CF2a at the same or similar level. A plurality of third color filters CF3 may have their top surfaces CF3a at the same or similar level. Therefore, the image sensor 1 may exhibit more improved image properties.

In other embodiments, the image sensor 1 may further include a fifth color filter, which fifth color filter may be transparent to light whose wavelength is different from those of light passing through the gap-fill portion 610 and the first, second, and third color filters CF1, CF2, and CF3. For example, when the image sensor 1 detects an infrared ray, the fifth color filter may be an infrared filter.

The following will now describe a method of fabricating an image sensor according to some example embodiments.

FIGS. 2A to 2M illustrate cross-sectional views showing a method of fabricating an image sensor according to some example embodiments of the present inventive concepts. A duplicate description of components discussed above will be omitted below.

Figure 2A:
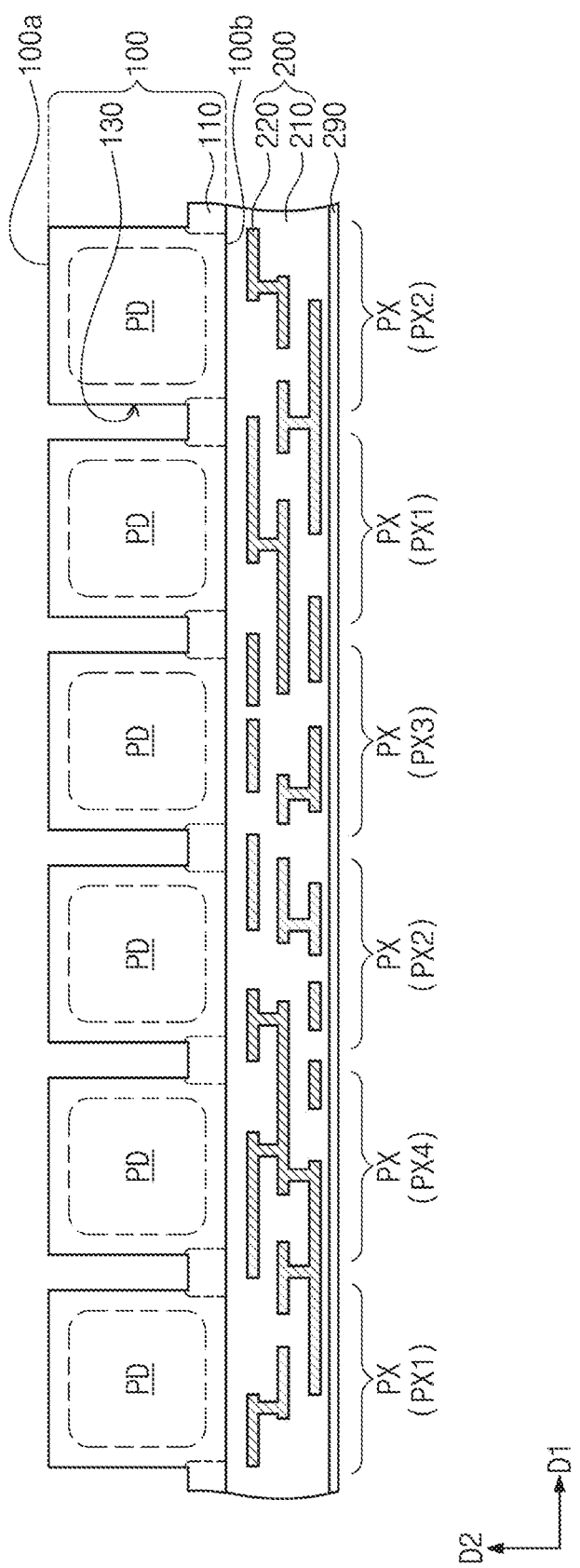

Referring to FIG. 2A, a substrate 100 may be prepared to have pixel regions PX. The substrate 100 may be a wafer-level substrate. For example, a semiconductor wafer may be used as the substrate 100. The substrate 100 may be doped with impurities of a first conductive type. The substrate 100 may be implanted therein with impurities of a second conductive type to form photoelectric conversion parts PD. A second surface 100b of the substrate 100 may be implanted with impurities of the first conductive type to form a device isolation region 110. Transistors may be formed on the second surface 100b of the substrate 100. An interlayer dielectric layer 210 and connection line structures 220 may be formed on the second surface 100b of the substrate 100, with the result that a connection line layer 200 may be fabricated. A passivation layer 290 may further be formed on a bottom surface of the connection line layer 200.

A first surface 100a of the substrate 100 may undergo a grinding process to thin the substrate 100. The first surface 100a of the thinned substrate 100 may undergo an etching process to form a trench 130. The trench 130 may extend from the first surface 100a toward the second surface 100b of the substrate 100. The trench 130 may be a deep trench. The trench 130 may vertically overlap the device isolation region 110. The trench 130 may have a bottom surface exposing the device isolation region 110.

Figure 2B:
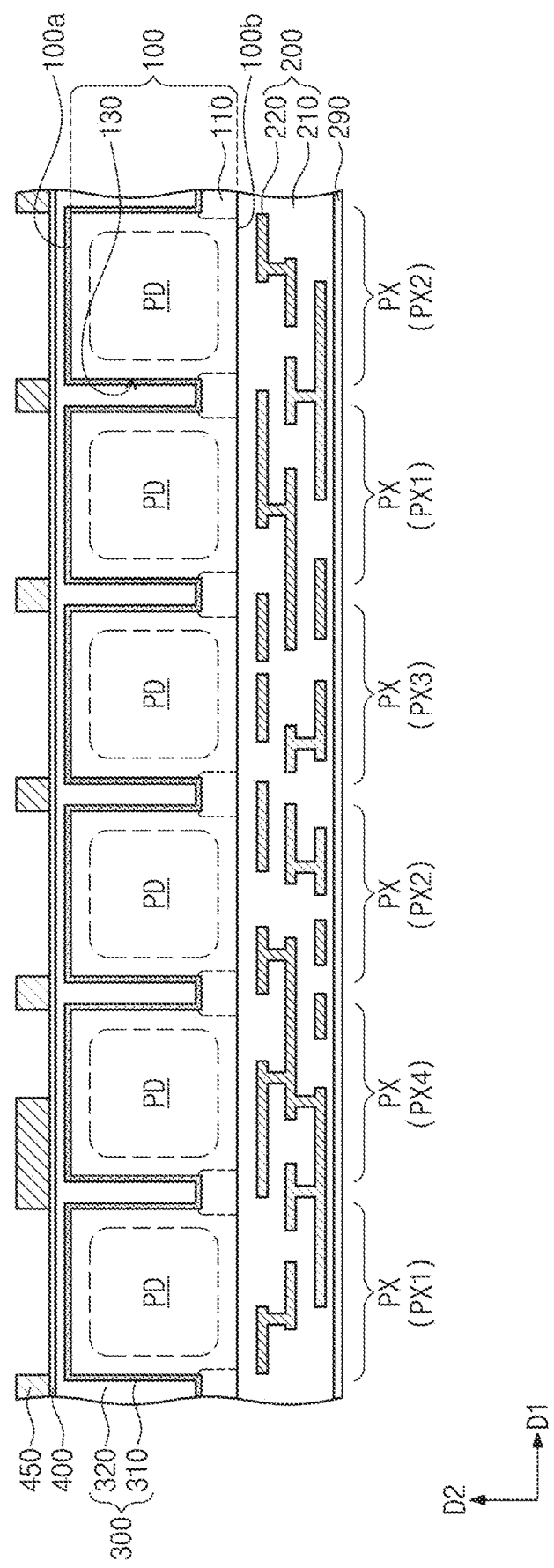

Referring to FIG. 2B, a device isolation pattern 300 and an adhesive layer 40.0 may be formed on the first surface 100a of the substrate 100. The device isolation pattern 300 may include a fixed charge layer 310 and a buried dielectric layer 320. In some embodiments, metal oxide or metal fluoride may be conformally coated on the first surface 100a of the substrate 100 and on an inner wall of the trench 130, which may result in the formation of the fixed charge layer 310. The buried dielectric layer 320 may be formed on the fixed charge layer 310, filling the trench 130. The buried dielectric layer 320 may extend onto the fixed charge layer 310 on the first surface 100a of the substrate 100.

The adhesive layer 400 may be formed on the device isolation pattern 300, on or covering a top surface of the buried dielectric layer 320. The adhesive layer 400 may include metal oxide, such as aluminum oxide discussed above.

A light-shielding pattern 450 may be formed on the adhesive layer 400. For example, a light-shielding layer may be formed to cover the adhesive layer 400. The light-shielding layer may be patterned to form the light-shielding pattern 450. The light-shielding pattern 450 may vertically overlap the device isolation pattern 300 and may expose the adhesive layer 400.

Figure 2C:
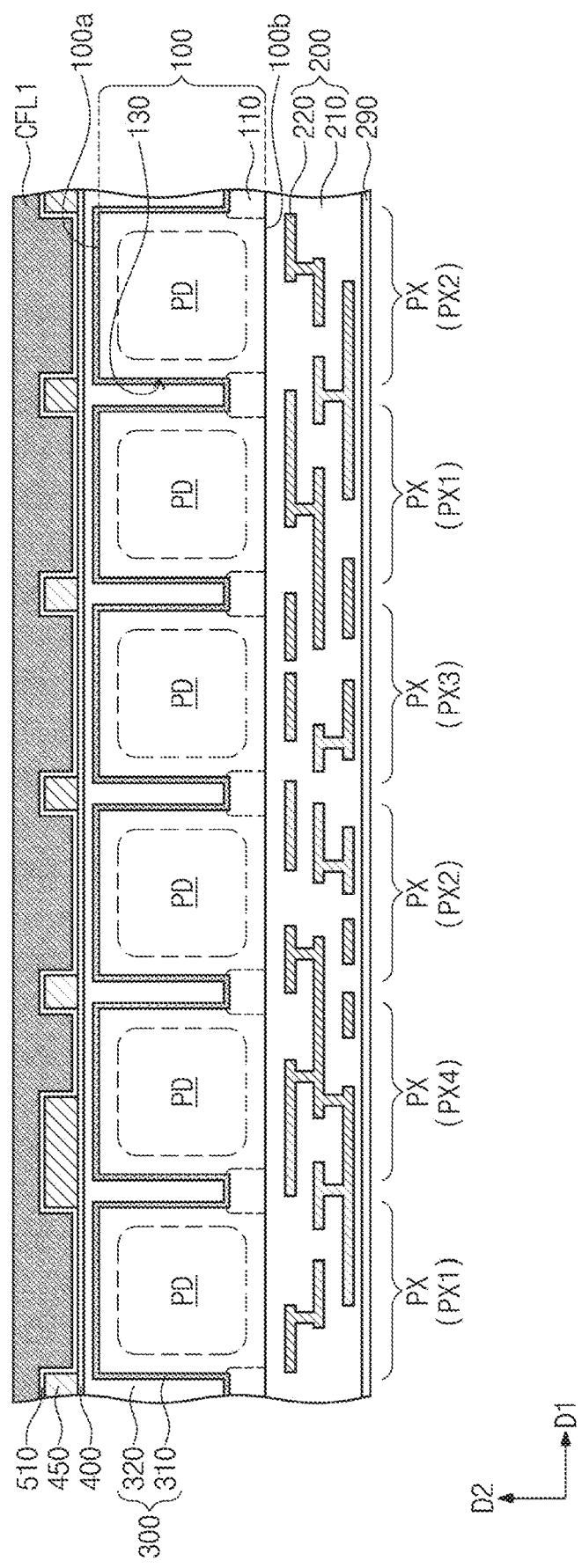

Referring to FIG. 2C, a first adhesive pattern 510 may be formed on the first surface 100a of the substrate 100, on or covering the adhesive layer 400 and the light-shielding pattern 450. For example, the first adhesive pattern 510 may conformally cover a top surface of the adhesive layer 400 on first, second, third, and fourth pixel regions PX1, PX2, PX3, and PX4, and also conformally cover top and lateral surfaces of the light-shielding pattern 450. The first adhesive pattern 510 may be formed by a coating process using metal oxide. The coating process may be a spin coating process.

A first color filter layer CFL1 may be formed on the first, second, third, and fourth pixel regions PX1, PX2, PX3, and PX4 of the substrate 100, on or covering the first adhesive pattern 510. The first color filter layer CFL1 may be formed by a coating process such as spin coating. The first color filter layer CFL1 may include a first color filter material that is transparent to first wavelength light.

Figure 2D:
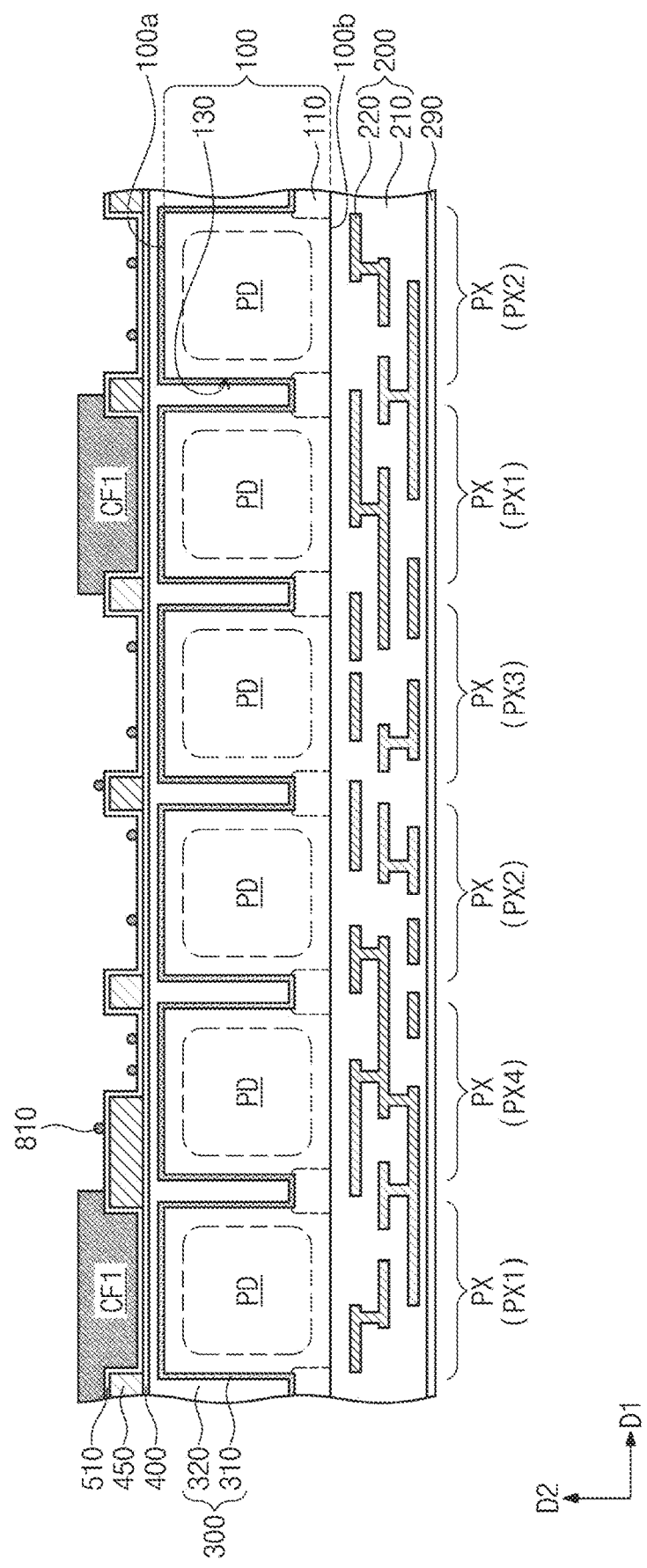

Referring to FIG. 2D, the first color filter layer CFL1 may be patterned to form a first color filter CF1 on the first pixel region PX1 of the substrate 100. Exposure and development processes may be performed to pattern the first color filter layer CFL1. The patterning of the first color filter layer CFL1 may include removing the first color filter layer CFL1 on the second, third, and fourth pixel regions PX2, PX3, and PX4 of the substrate 100. Therefore, the first color filter CF1 may be provided locally on the adhesive layer 400 of the first pixel region PX1 of the substrate 100. The patterning of the first color filter layer CFL1 may produce first residues 810 on the first adhesive pattern 510 of the second, third, and fourth pixel regions PX2, PX3, and PX4 of the substrate 100. The first residues 810 may include residues resulting from the first color filter layer CFL1.

Figure 2E:
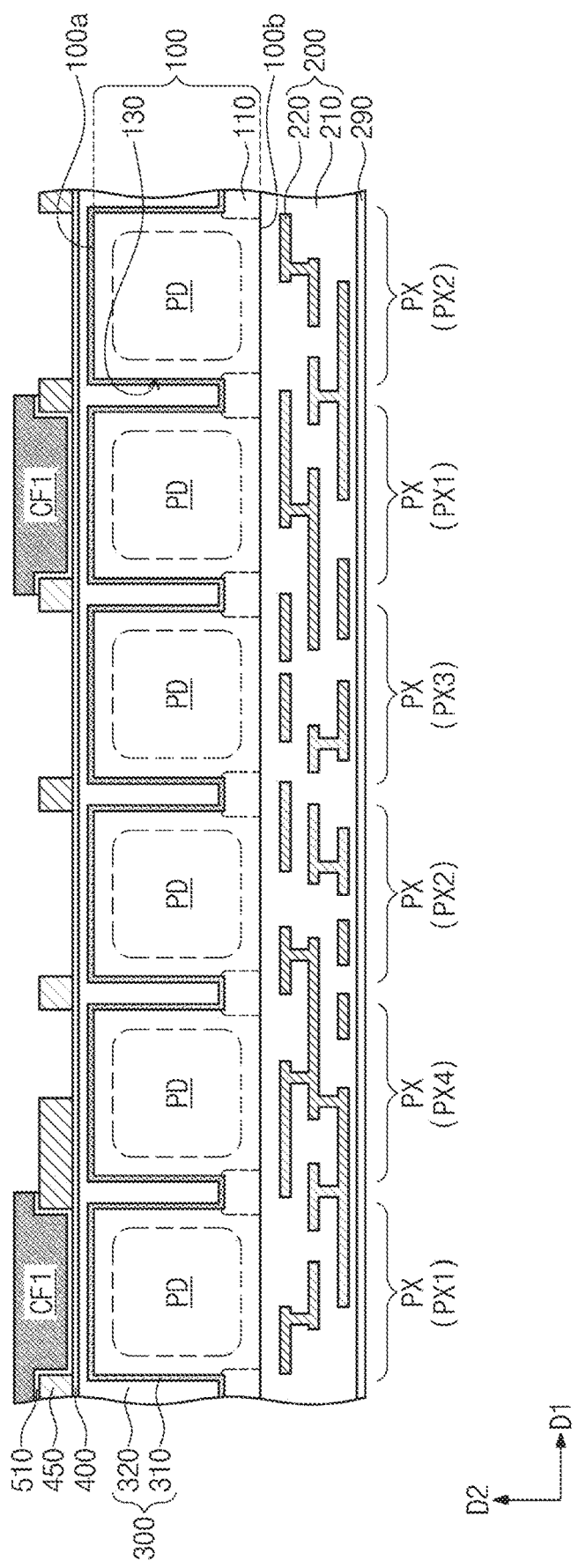

Referring successively to FIGS. 2D and 2E, a first etching process may be performed on the first color filter CF1 and the first adhesive pattern 510. The first etching process may be a dry etching process. The first etching process may be a plasma etching process in which one or more of CF4, 02, and 03 are used as an etching gas. In the first etching process, an etch rate may be higher for the first adhesive pattern 510 than for the first color filter CF1.

The first etching process may remove the first residues 810. When the first etching process is performed, the first adhesive pattern 510 on the second, third, and fourth pixel regions PX2, PX3, and PX4 may be removed to expose the adhesive layer 400 and the light-shielding pattern 450 on the second, third, and fourth pixel regions PX2, PX3, and PX4. The first, adhesive pattern 510 may reduce or prevent the adhesive layer 400 on the second to fourth pixel regions PX2 to PX4 from being excessively damaged during the first etching process. The first etching process may reduce a height of the first color filter CF1.

The first adhesive pattern 510 on the first pixel region PX1 of the substrate 100 may be protected by the first color filter CF1 from the first etching process. The first adhesive pattern 510 may remain between the adhesive layer 400 and the first color filter CF1.

Figure 2F:
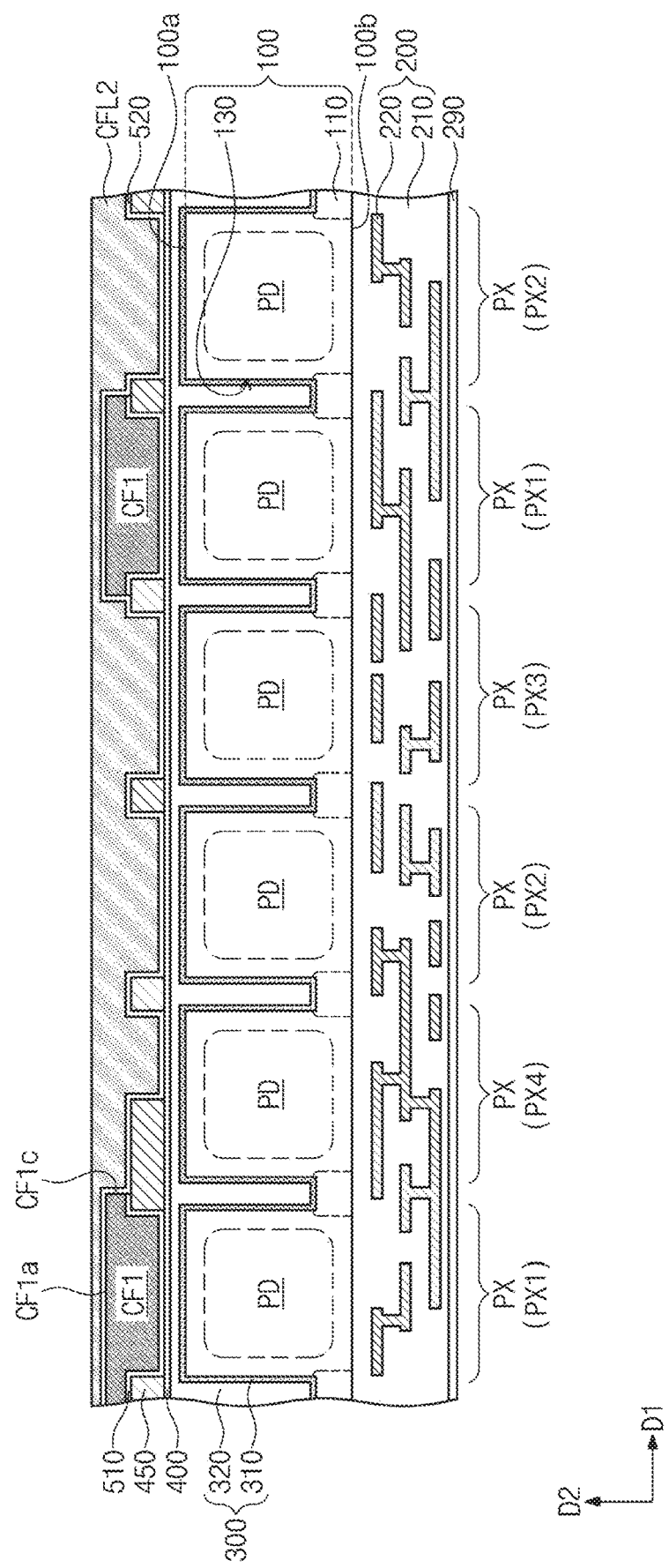

Referring to FIG. 2F, a second adhesive pattern 520 may be formed on the first surface 100a of the first, second, third, and fourth pixel regions PX1, PX2, PX3, and PX4 of the substrate 100. The second adhesive pattern 520 may conformally extend on or cover the adhesive layer 400 and the light-shielding pattern 450 on the second, third, and fourth pixel regions PX2, PX3, and PX4, and may extend onto a lateral surface CF1c and a top surface CF1a of the first color filter CF1. The second adhesive pattern 520 may be formed of the same material as that of the first adhesive pattern 510. The second adhesive pattern 520 may be formed by a spin coating process.

A second color filter layer CFL2 may be formed on the first surface 100a of the first, second, third, and fourth pixel regions PX1, PX2, PX3, and PX4 of the substrate 100, covering the second adhesive pattern 520. The second color filter layer CFL2 may be formed by, for example, a spin coating process.

Figure 2G:
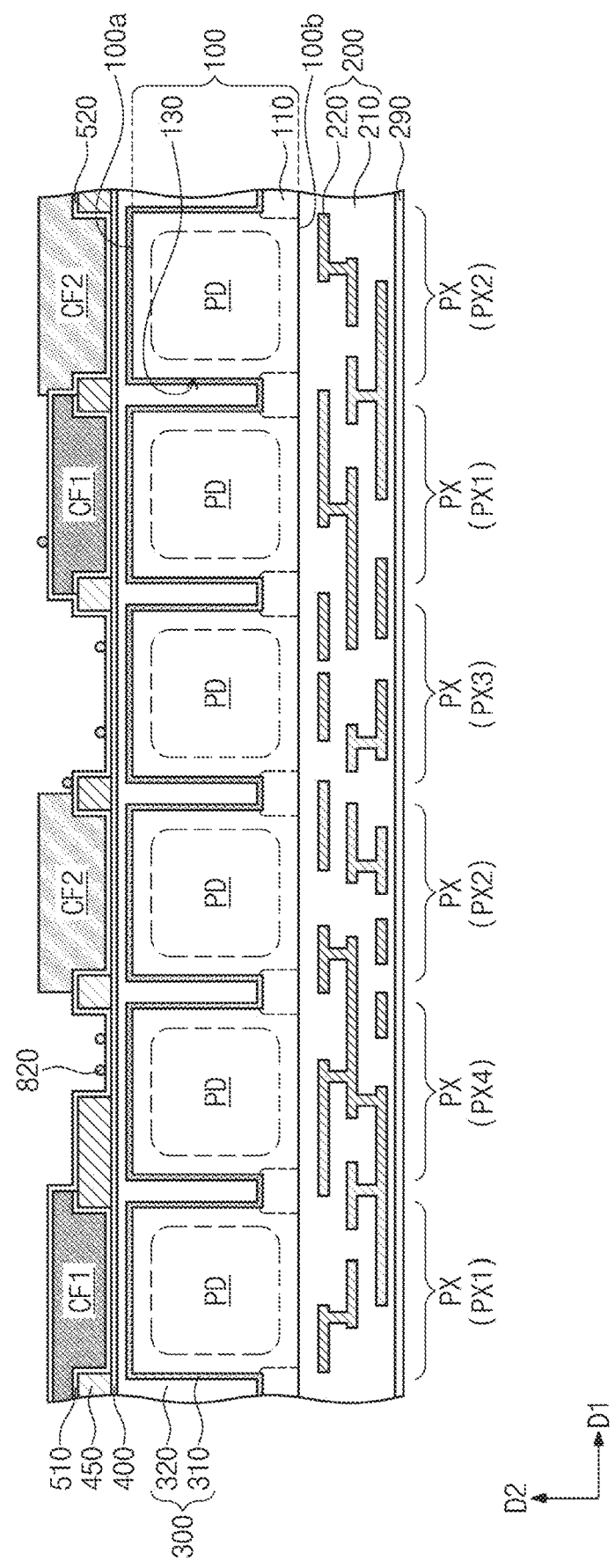

Referring to FIG. 2G, the second color filter layer CFL2 may be patterned to form a second color filter CF2 on the second pixel region PX2 of the substrate 100. Exposure and development processes may be performed to pattern the second color filter layer CFL2. The patterning of the second color filter layer CFL2 may include removing the second color filter layer CFL2 on the first, third, and fourth pixel regions PX1, PX3, and PX4 of the substrate 100. The removal of the second color filter layer CFL2 may expose the adhesive layer 400 on the first, third, and fourth pixel regions PX1, PX3, and PX4. The second color filter CF2 may be provided locally on the second adhesive pattern 520 of the second pixel region PX2 of the substrate 100. After the patterning of the second color filter layer CFL2, second residues 820 may remain on the second adhesive pattern 520. The second residues 820 may include residues resulting from the second color filter layer CFL2.

Figure 2H:
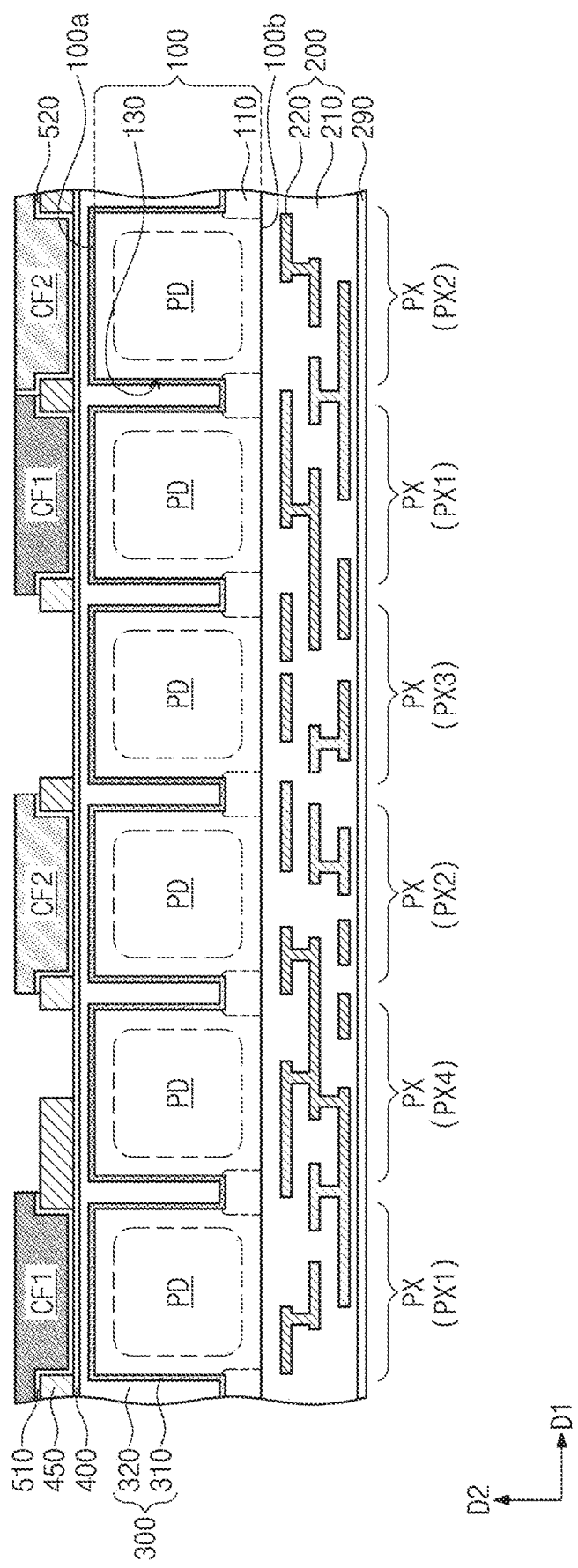
Figure 21:
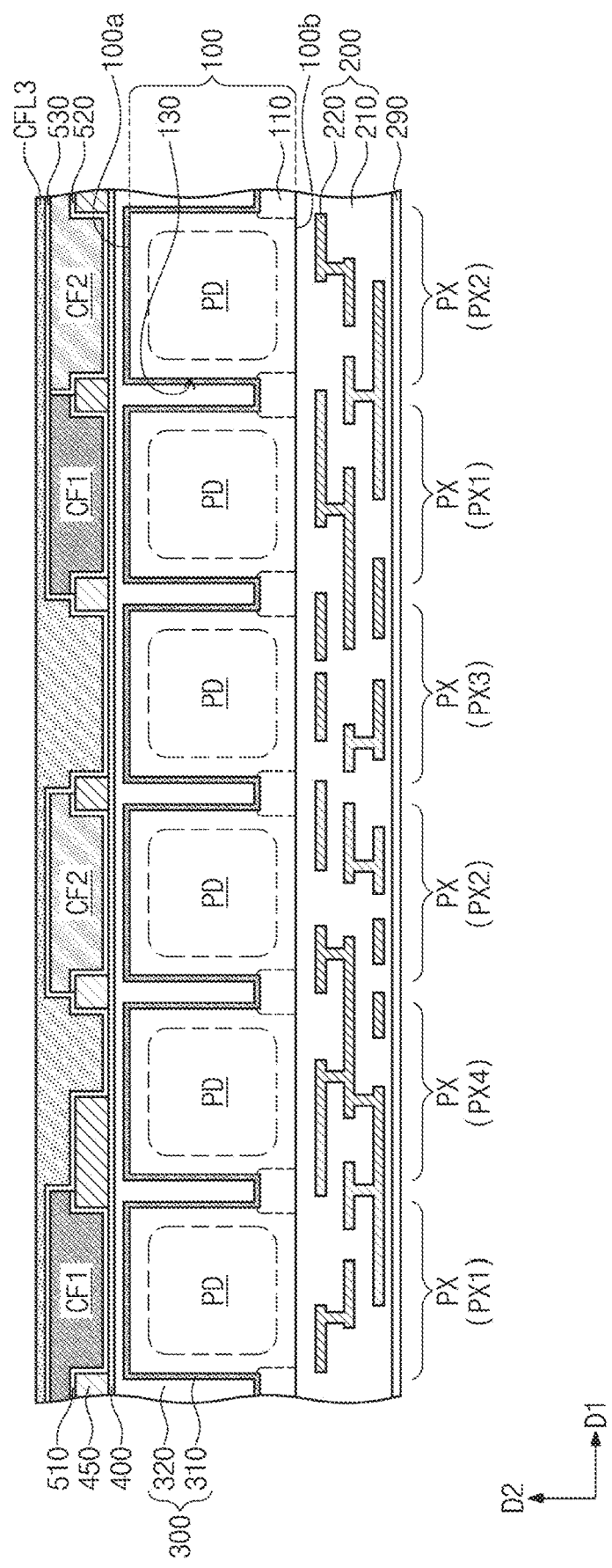

Referring successively to FIGS. 2G and 2H, a second etching process may be performed on the second adhesive pattern 520. The second etching process may be a dry plasma etching process in which one or more of CF4, 02, and 03 are used as an etching gas. In the second etching process, an etch rate may be higher for the second adhesive pattern 520 than for the first and second color filters CF1 and CF2. The second etching process may remove the second residues 820 and the exposed second adhesive pattern 520. Therefore, the adhesive layer 400 and the light-shielding pattern 450 on the third and fourth pixel regions PX3 and PX4 may be exposed, and the first color filter CF1 may also be exposed on the first pixel regions PX1. The second adhesive pattern 520 may prevent the adhesive layer 400 on the third and fourth pixel regions PX3 and PX4 from being damaged due to the second etching process. The second etching process may reduce a height of the second color filter CF2.

The second adhesive pattern 520 may remain between the adhesive layer 400 and the second color filter CF2. When the first and second pixel regions PX1 and PX2 neighbor each other, the second adhesive pattern 520 may remain between the first and second color filters CF1 and CF2.

Referring to FIG. 2I, a third adhesive pattern 530 may be formed on the first surface 100a of the first, second, third, and fourth pixel regions PX1, PX2, PX3, and PX4 of the substrate 100. The third adhesive pattern 530 may conformally extend on or cover the first color filter CF1 and the second color filter CF2, and also conformally extend on or cover the adhesive layer 400 and the light-shielding pattern 450 on the third and fourth pixel regions PX3 and PX4. The third adhesive pattern 530 may be formed of the same material as that of the first adhesive pattern 510. The third adhesive pattern 530 may be formed by a spin coating process.

A third color filter layer CFL3 may be formed on the first surface 100a of the first, second, third, and fourth pixel regions PX1, PX2, PX3, and PX4 of the substrate 100, on or covering the third adhesive pattern 530. The third color filter layer CFL3 may be formed by a spin coating process.

Figure 2J:
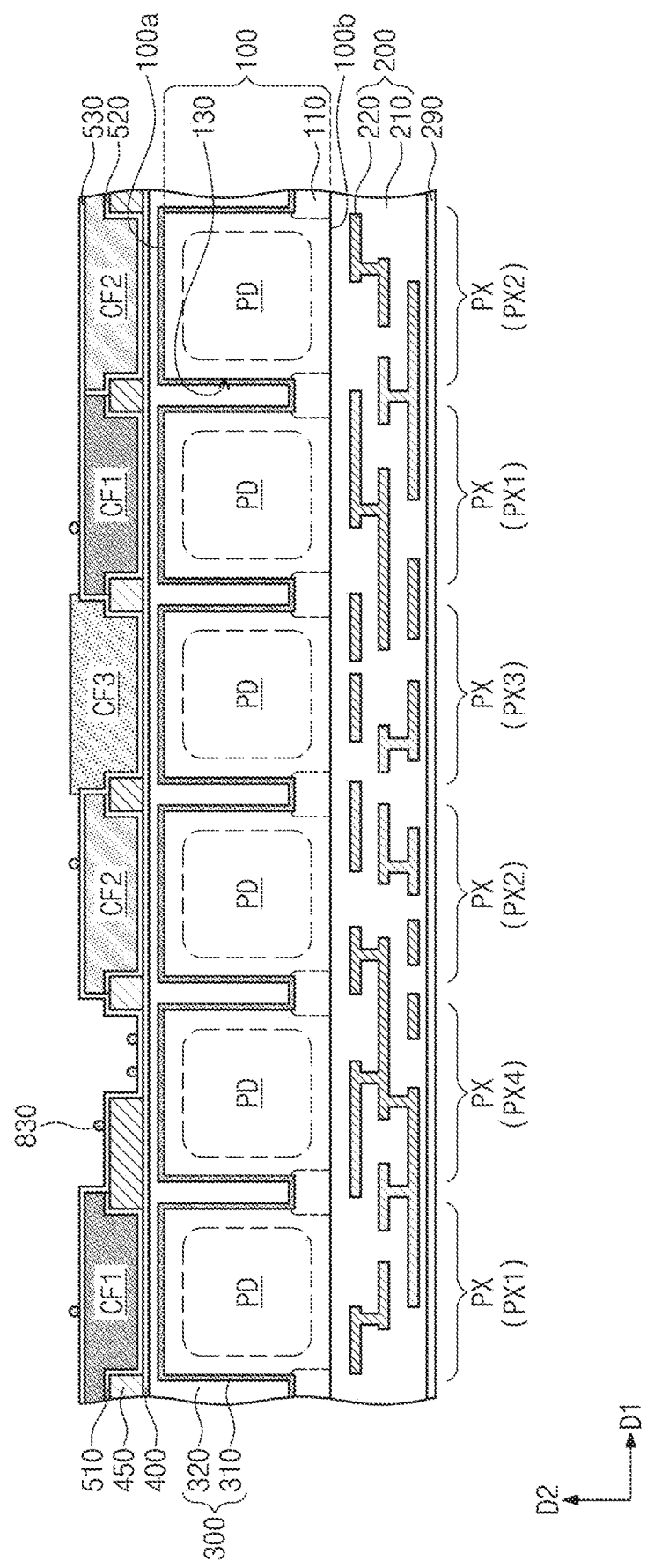

Referring to FIG. 2J, the third color filter layer CFL3 may be patterned to form a third color filter CF3 on the third pixel region PX3 of the substrate 100. Exposure and development processes may be performed to pattern the third color filter layer CFL3. The patterning of the third color filter layer CFL3 may include removing the third color filter layer CFL3 on the first, second, and fourth pixel regions PX1, PX2, and PX4 of the substrate 100. Therefore, the third color filter CF3 may be provided locally on the third adhesive pattern 530 of the third pixel region PX3 of the substrate 100. The removal of the third color filter layer CFL3 may expose the third adhesive pattern 530 on the first, second, and fourth pixel regions PX1, PX2, and PX4. After the patterning of the third color filter layer CFL3, third residues 830 may remain on the third adhesive pattern 530. The third residues 830 may include residues resulting from the third color filter layer CFL3.

Figure 2K:
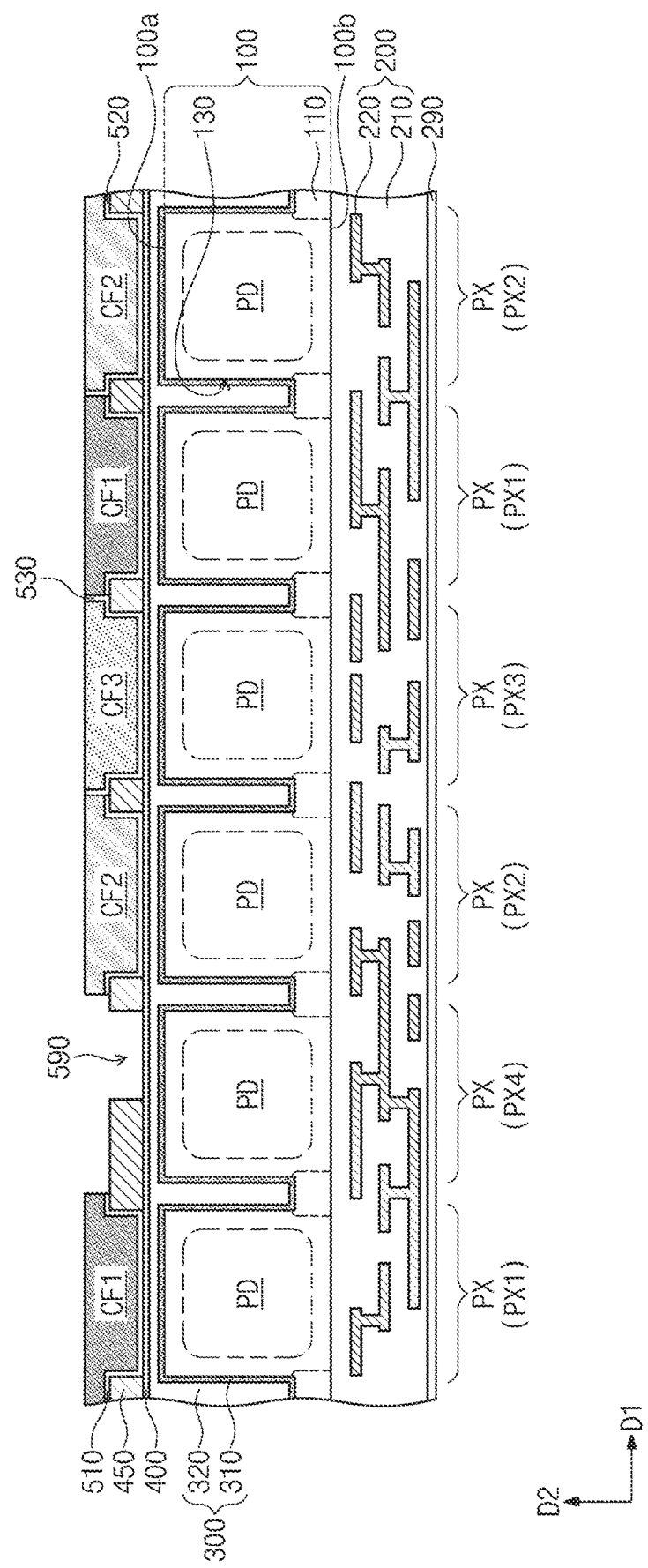

Referring successively to FIGS. 2J and 2K, a third etching process may be performed on the third adhesive pattern 530. The third etching process may be a dry plasma etching process in which one or more of CF4, 02, and 03 are used as an etching gas. In the third etching process, an etch rate may be higher for the third adhesive pattern 530 than for the first, second, and third color filters CF1, CF2, and CF3.

The third etching process may remove the third residues 830 and the exposed third adhesive pattern 530. Therefore, top surfaces of the first and second color filters CF1 and CF2 may be exposed, and the adhesive layer 400 and the light-shielding pattern 450 on the fourth pixel region PX4 may also be exposed. A gap 590 may be formed between the first and second color filters CF1 and CF2. The third adhesive pattern 530 may reduce or prevent the adhesive layer 400 from being damaged due to the third etching process. The third etching process may reduce a height of the third color filter CF3. After the third etching process, the first, second, and third color filters CF1, CF2, and CF3 may have their top surfaces coplanar or at substantially the same level. As a result, striation defects may be reduced.

The third adhesive pattern 530 may remain between the adhesive layer 400 and the third color filter CF3, between the second and third color filters CF2 and CF3, and between the first and third color filters CF1 and CF3. For example, the third adhesive pattern 530 may be provided on a bottom surface of the third color filter CF3. The third adhesive pattern 530 may extend onto a sidewall or lateral surface of the third color filter CF3, and may contact one or more of the first and second color filters CF1 and CF2.

Figure 2L:
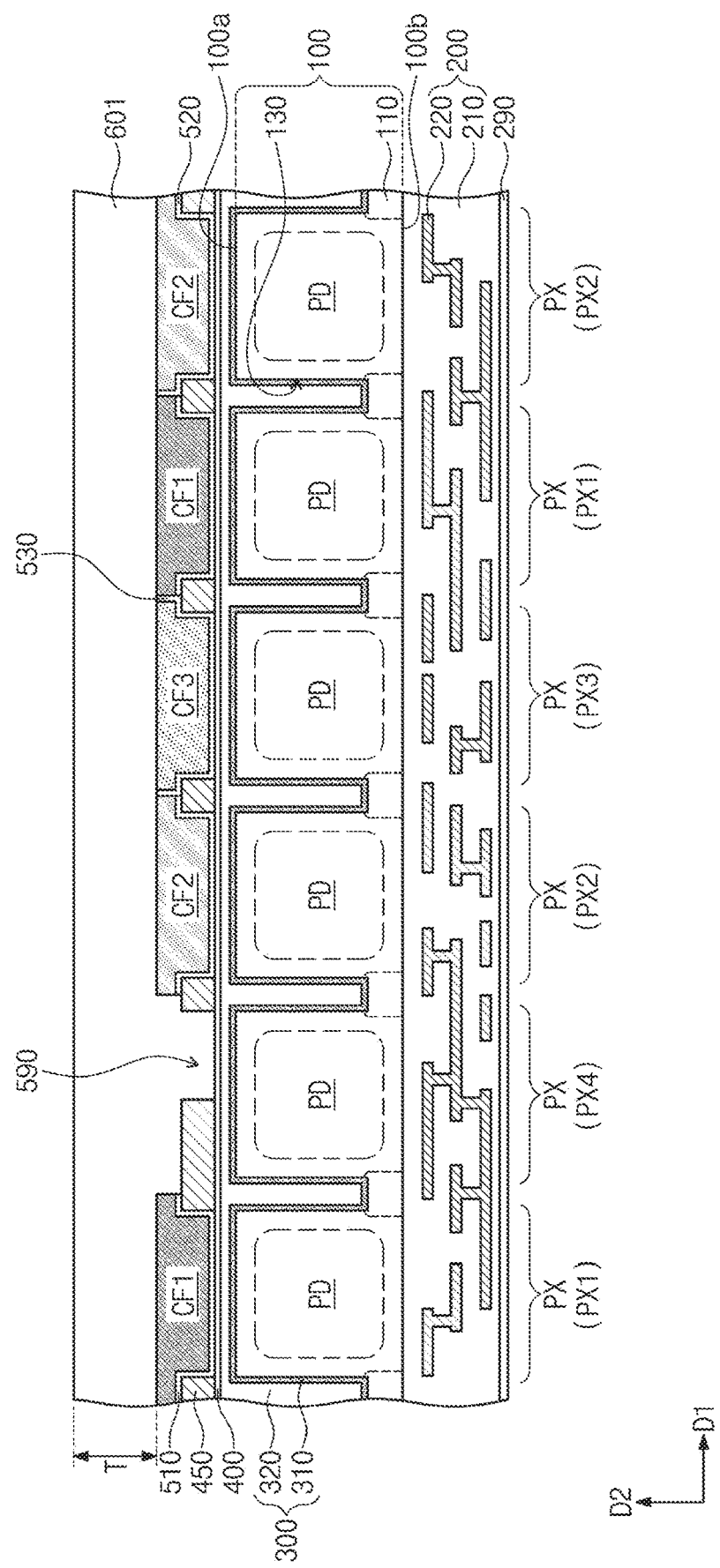

Referring to FIG. 2L, a preliminary lens layer 601 may be formed on the first surface 100a of the substrate 100, on or covering the top surfaces of the first, second, and third color filters CF1, CF2, and CF3. The preliminary lens layer 601 may be formed by a spin coating process that uses a photoresist material or a thermosetting resin. The preliminary lens layer 601 may extend into and fill the gap 590 between the first and second color filters CF1 and CF2. Thus, the preliminary lens layer 601 may have a gap-fill portion 610 as shown in FIG. 1D, and the gap-fill portion 610 may be formed between a lateral surface of the first color filter CF1 and a lateral surface of the second color filter CF2, that is, between opposing sidewalls of the color filters CF1 and CF2. On the fourth pixel region PX4 of the substrate 100, the gap-fill portion 610 may directly contact the adhesive layer 400 and the light-shielding pattern 450. The formation of the gap-fill portion 610 may omit the fabrication of a fourth color filter. An image sensor may thus be manufactured in a simplified process. When a fourth color filter is separately formed, exposure and development processes may be performed to pattern the fourth color filter. In this case, a deficient amount of exposure may generate defects, such as voids, in the fourth color filter. In some embodiments, neither exposure nor development processes may be performed to form the preliminary lens layer 601. Therefore, the gap-fill portion 610 may be provided therein without or substantially free of defects, such as voids.

When the preliminary lens layer 601 has a thickness T of less than 1.8 μm, a top surface of the preliminary lens layer 601 may become severely curved. For example, the top surface of the preliminary lens layer 601 on the fourth pixel region PX4 may be located at a level significantly lower than or non-coplanar with that of the top surface of the preliminary lens layer 601 on the top surfaces of the first, second, and third color filters CF1, CF2, and CF3. When the preliminary lens layer 601 has a thickness T of greater than 3.5 µm, an image sensor may not meet compactness requirements. In some embodiments, the preliminary lens layer 601 may have a thickness T of about 1.8 µm to about 3.5 µm. The thickness T of the preliminary lens layer 601 may indicate an average interval between the top surface of the preliminary lens layer 601 and the top surfaces of the first, second, and third color filters CF1, CF2, and CF3.

The preliminary lens layer 601 may be annealed at temperatures between 200° C. and 300° C. Even though the top surface of the preliminary lens layer 601 is partially curved, the preliminary lens layer 601 may have fluidity to flow during the annealing process. The top surface of the preliminary lens layer 601 may be more planar after the annealing process than before the annealing process. After the annealing process, the preliminary lens layer 601 may have top surfaces that are coplanar or at substantially the same level on the first, second, third, and fourth pixel regions PX1, PX2, PX3, and PX4.

Figure 2M:
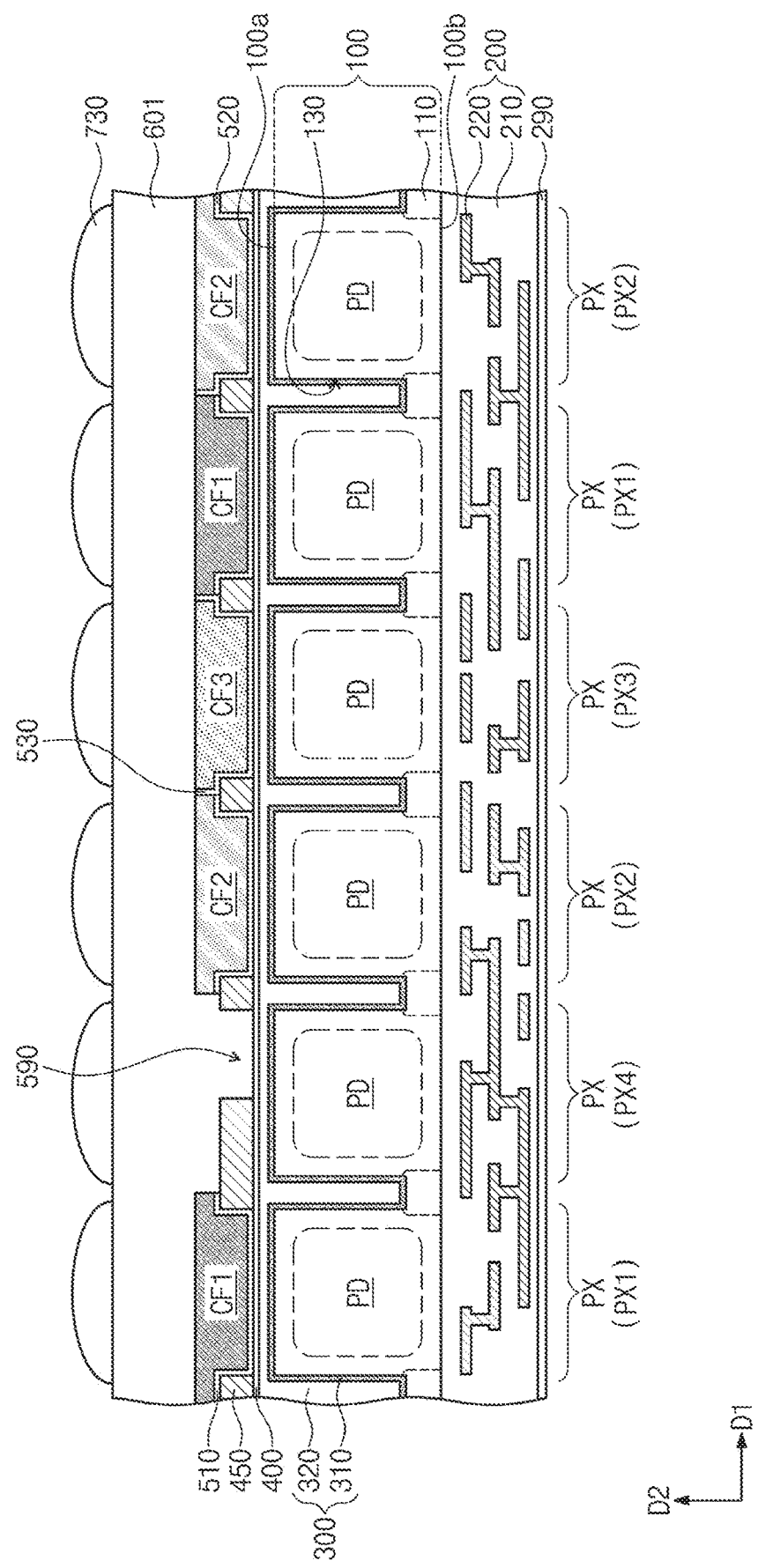

Referring to FIG. 2M, sacrificial lens patterns 730 may be formed on the preliminary lens layer 601. The sacrificial lens patterns 730 may be formed on positions corresponding to the pixel regions PX of the substrate 100. The formation of the sacrificial lens patterns 730 may include forming a sacrificial layer on the preliminary lens layer 601, patterning the sacrificial layer to form sacrificial patterns, and reflowing the sacrificial patterns. The sacrificial patterns may be reflowed to form the sacrificial lens patterns 730. Each of the sacrificial lens patterns 730 may have a hemispheric or hemi-ellipsoid shape.

Referring successively to FIGS. 2M and 1A, the sacrificial lens patterns 730 may undergo an etching process to from a micro-lens layer 600. The etching process may transfer shapes of the sacrificial lens patterns 730 onto the preliminary lens layer 601. The etching process may continue until the sacrificial lens patterns 730 are completely removed. Therefore, lens portions 630 of the micro-lens layer 600 may be formed, and may have shapes corresponding to those of the sacrificial lens patterns 730. For example, each of the lens portions 630 may have a hemispheric or hemi-ellipsoid shape.

A sawing process may further be performed on the micro-lens layer 600, the device isolation pattern 300, the substrate 100, and the connection line layer 200. Thus, the wafer-level substrate 100 may be separated into chip-level substrates 100. The sawing process may dice the adhesive patterns 510, 520, and 530, and the adhesive layer 400 simultaneously with each other. As a result, an image sensor 1 may be fabricated as shown in FIGS. 1A to 1D.

Figure 2N:
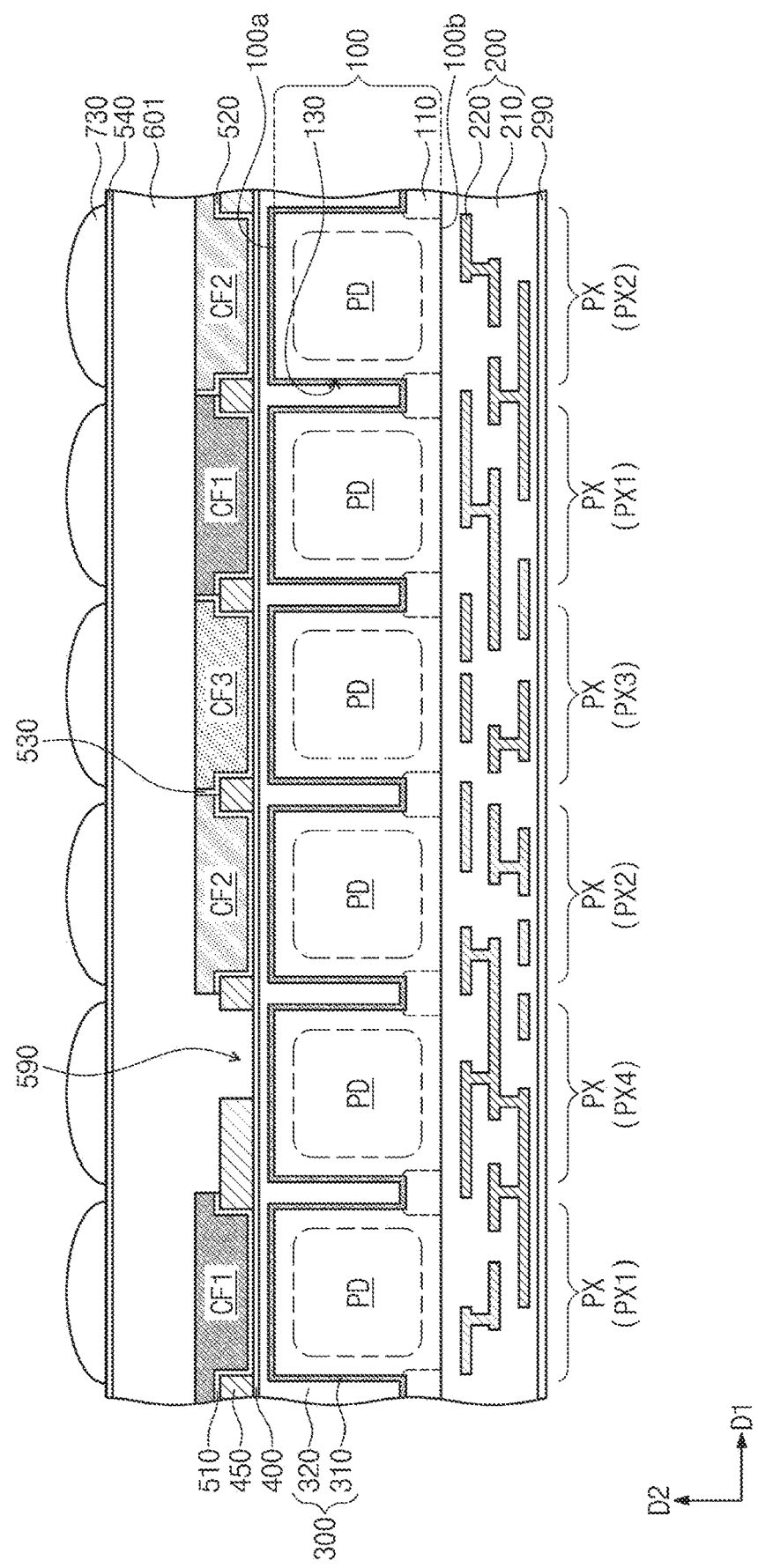
FIG. 2N illustrates a cross-sectional view showing a method of forming a micro-lens layer according to some example embodiments.

FIG. 2N illustrates a cross-sectional view showing a method of forming a micro-lens layer according to some example embodiments of the present inventive concepts. Duplicate description of elements described above with reference to FIGS. 2A to 2M will be omitted below.

Referring to FIG. 2N, processes substantially similar to or the same as those discussed above with reference to FIGS. 2A to 2M may be performed to form the substrate 100, the connection line layer 200, the device isolation pattern 300, the adhesive layer 400, the light-shielding pattern 450, the first, second, and third adhesive patterns 510, 520, and 530, the first, second, and third color filters CF1, CF2, and CF3, the preliminary lens layer 601, and the sacrificial lens patterns 730. In contrast, a fourth adhesive pattern 540 may further be formed between the preliminary lens layer 601 and the sacrificial lens patterns 730. For example, the fourth adhesive pattern 540 may be formed on the top surface of the preliminary lens layer 601, and the sacrificial lens patterns 730 may be formed on the fourth adhesive pattern 540. The fourth adhesive pattern 540 may attach the sacrificial lens patterns 730 to the preliminary lens layer 601. The fourth adhesive pattern 540 may include an organic material, such as acryl-based polymer.

The sacrificial lens patterns 730 may undergo an etching process to form the micro-lens layer 600 of FIG. 1A. The etching process may continue until the sacrificial lens patterns 730 and the fourth adhesive pattern 540 are completely removed. As a result, the image sensor 1 may be fabricated as shown in FIGS. 1A to 1D.

Figure 3A:
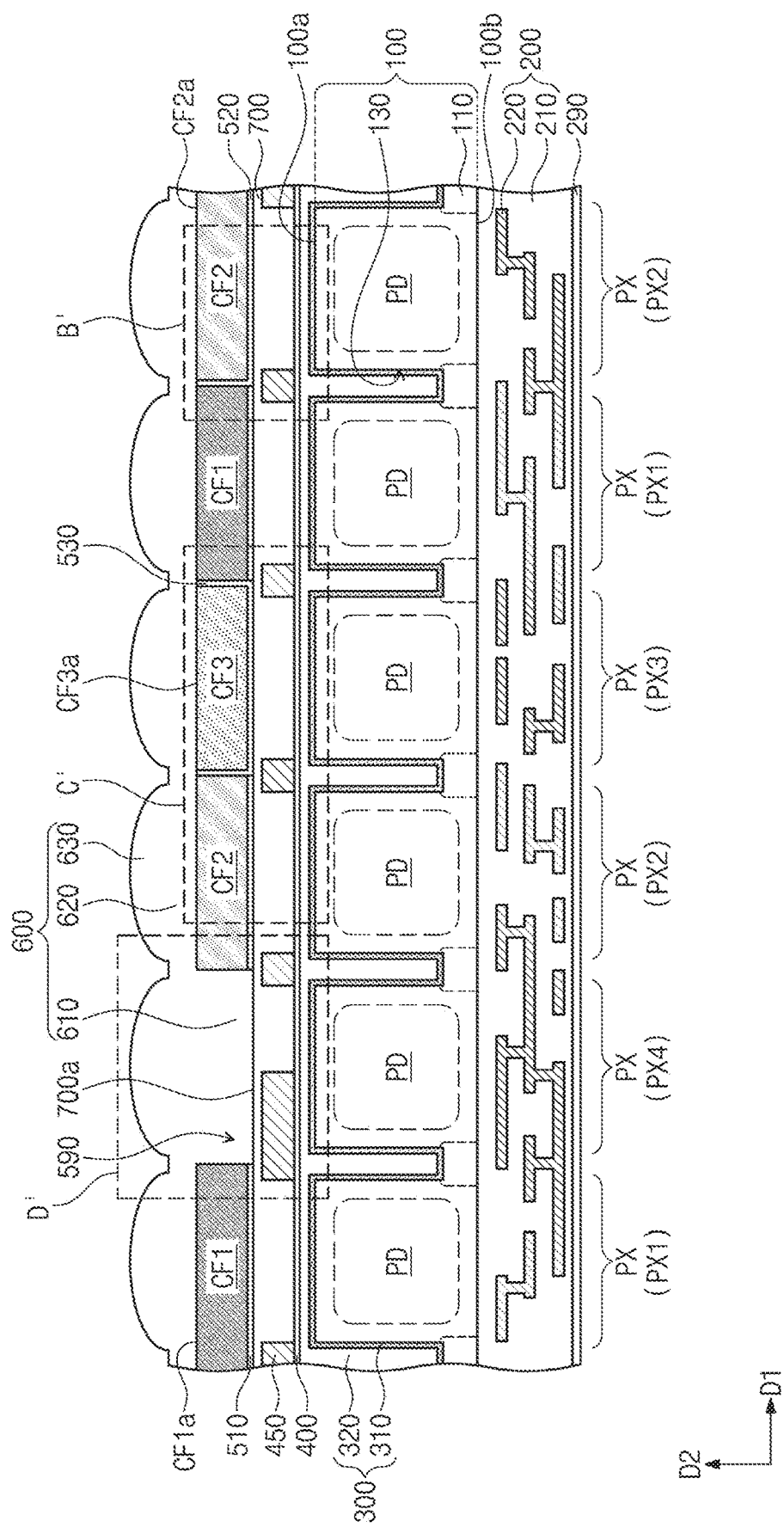
FIG. 3A illustrates a cross-sectional view showing an image sensor according to some example embodiments.
Figure 3B:
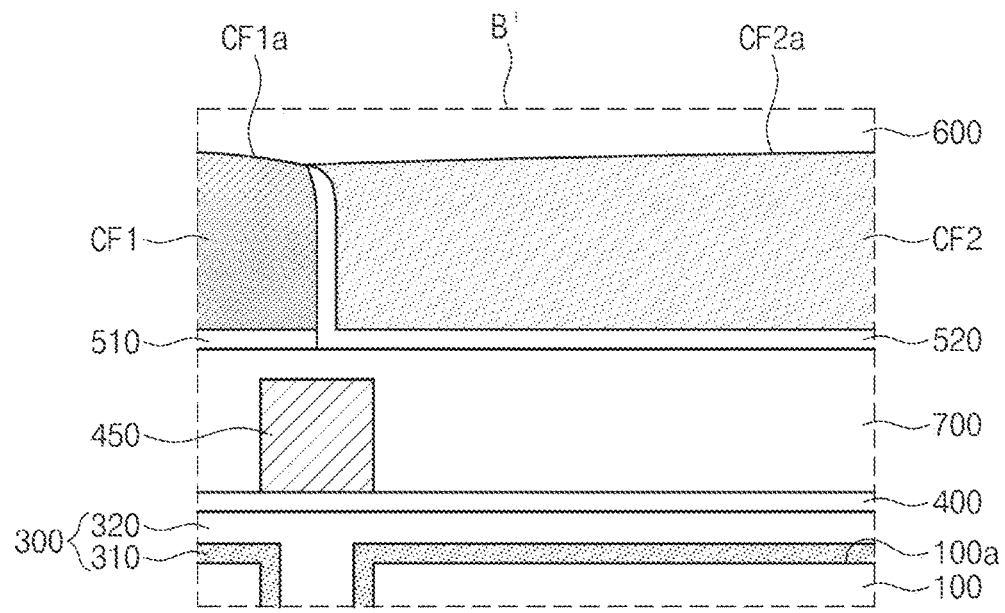
FIG. 3B illustrates an enlarged view showing section B' of FIG. 3A.
Figure 3C:
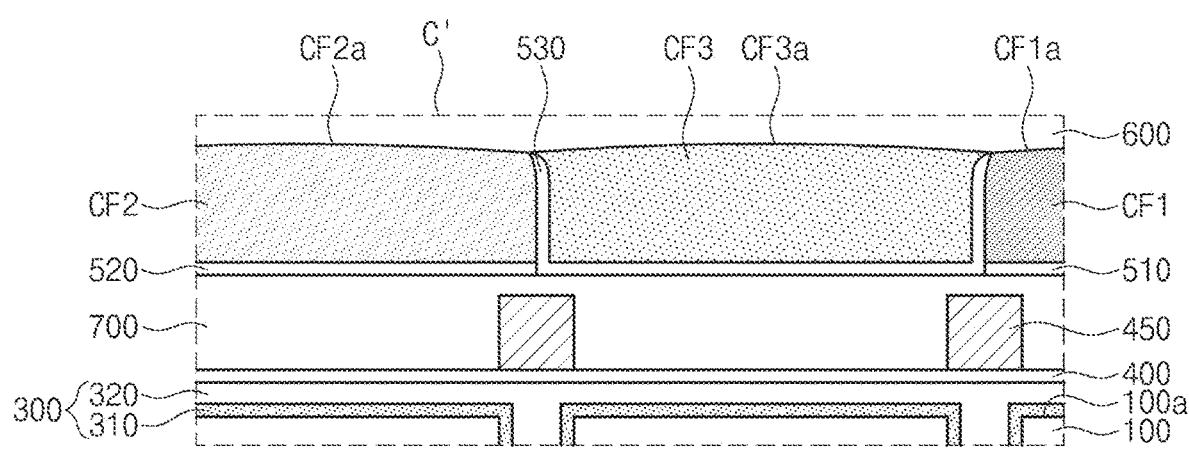
FIG. 3C illustrates an enlarged view showing section C' of FIG. 3A.
Figure 3D:
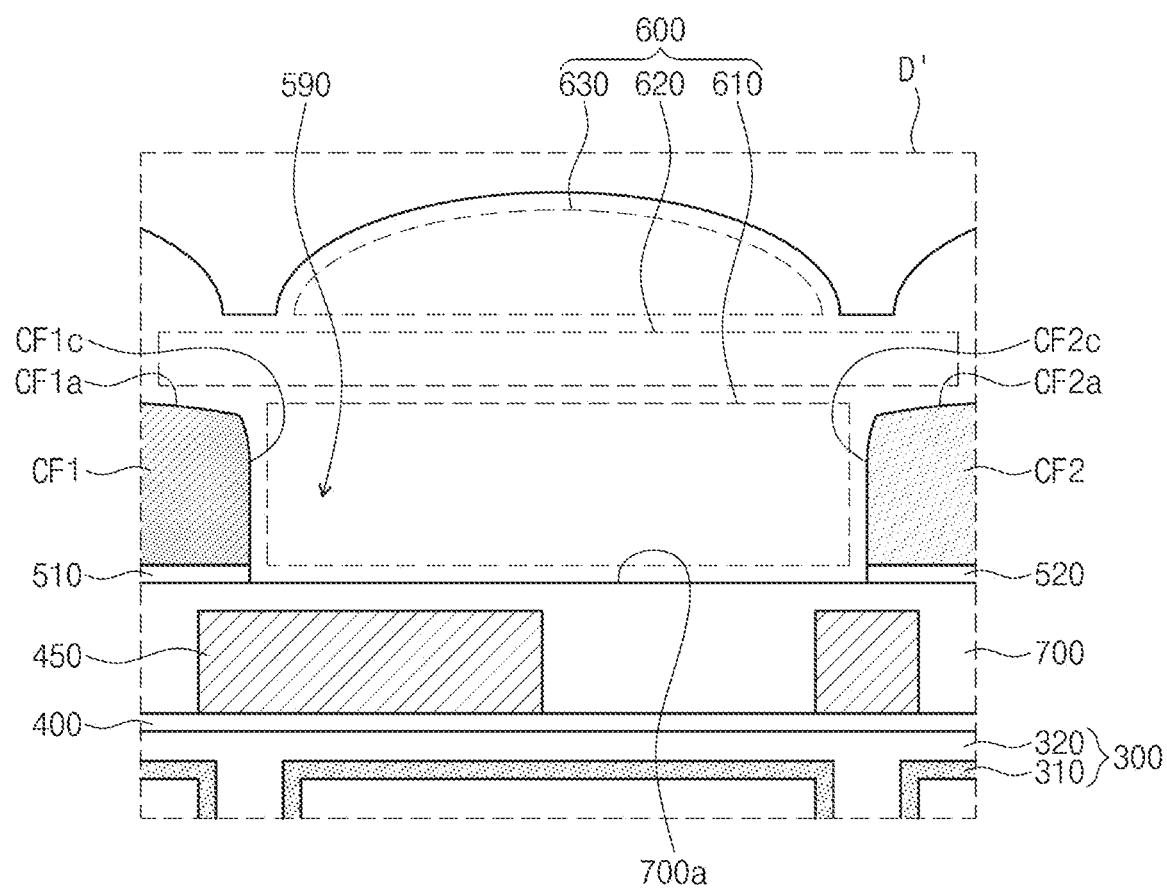
FIG. 3D illustrates an enlarged view showing section D' of FIG. 3A.

FIG. 3A illustrates a cross-sectional view showing an image sensor according to some example embodiments of the present inventive concepts. FIG. 3B illustrates an enlarged view showing section B' of FIG. 3A. FIG. 3C illustrates an enlarged view showing section C' of FIG. 3A. FIG. 3D illustrates an enlarged view showing section D' of FIG. 3A. Duplicate description of similar elements described above will be omitted below.

Referring to FIGS. 3A to 3D, an image sensor 2 may include the substrate 100, the connection line layer 200, the device isolation pattern 300, the adhesive layer 400, the light-shielding pattern 450, the first, second, and third adhesive patterns 510, 520, and 530, the color filters CF1, CF2, and CF3, and the micro-lens layer 600, and further include a planarization layer 700. The planarization layer 700 may be a lower layer.

The planarization layer 700 may be provided on the first surface 100a of the first, second, third, and fourth pixel regions PX1, PX2, PX3, and PX4 of the substrate 100, on or covering the adhesive layer 400 and the light-shielding pattern 450. The planarization layer 700 may be transparent to light in the visible light range. For example, the planarization layer 700 may have a transmittance of 90% or higher to light in the visible light range. The planarization layer 700 may include a photoresist material or a thermosetting resin. The planarization layer 700 may include, for example, the same material as that of the micro-lens layer 600. The planarization layer 700 may have a substantially flat or planar top surface 700a. For example, the top surface 700a of the planarization layer 700 may be flatter than a bottom surface thereof, and the bottom surface of the planarization layer 700 may include height differences that may conform to and/or contact top surfaces of the light-shielding pattern 450 and the adhesive layer 400.

The color filters CF1, CF2, and CF3 may be provided on the top surface 700a of the planarization layer 700. Because the top surface 700a of the planarization layer 700 is substantially flat, the top surfaces CF1a, CF2a, and CF3a of the color filters CF1, CF2, and CF3 may be located at substantially the same or similar level. Therefore, the image sensor 2 may exhibit improved image properties. None of the color filters CF1, CF2, and CF3 may be provided on the planarization layer 700 of the fourth pixel region PX4 of the substrate 100. The gap 590 may be provided between the first and second color filters CF1 and CF2. The gap 590 may expose the top surface 700a of the planarization layer 700.

The first adhesive pattern 510 may be interposed between the planarization layer 700 and the first color filter CF1. The first adhesive pattern 510 may be spaced apart from the second and third color filters CF2 and CF3. The second adhesive pattern 520 may be interposed between the planarization layer 700 and the second color filter CF2. As shown in FIG. 3B, the second adhesive pattern 520 may further extend to a location between neighboring first and second color filters CF1 and CF2, contacting the first color filter CF1, e.g., at a lateral surface or sidewall thereof.

The third adhesive pattern 530 may be interposed between the planarization layer 700 and the third color filter CF3. As shown in FIG. 3C, the third adhesive pattern 530 may further extend to a location between the first and third color filters CF1 and CF3, contacting the first color filter CF1, e.g., at a lateral surface or sidewall thereof. The third adhesive pattern 530 may further extend to a location between the second and third color filters CF2 and CF3, contacting the second color filter CF2, e.g., at a lateral surface or sidewall thereof. The adhesive patterns 510, 520, and 530 may separate the color filters CF1, CF2, and CF3 from the planarization layer 700. As shown in FIG. 3A, none of the first, second, and third adhesive patterns 510, 520, and 530 may be provided on the planarization layer 700 of the fourth pixel region PX4 of the substrate 100.

The micro-lens layer 600 may be disposed on the top surfaces CF1a, CF2a, and CF3a of the first, second, and third color filters CF1, CF2, and CF3. As shown in FIG. 3D, the gap-fill portion 610 of the micro-lens layer 600 may be provided between the lateral surface CF1c of the first color filter CF1 and the lateral surface CF2c of the second color filter CF2. The gap-fill portion 610 of the micro-lens layer 600 may contact (e.g., directly) the planarization layer 700 on the fourth pixel region PX4 of the substrate 100. The gap-fill portion 610 may overlap the photoelectric conversion part PD of the fourth pixel region PX4. The micro-lens layer 600 may have a transmittance of 90% or higher to light in the visible light range. The gap-fill portion 610 may serve as a white color filter.

The photoelectric conversion parts PD, the device isolation region 110, the connection line layer 200, and the device isolation pattern 300 may be substantially the same as those discussed above with reference to FIGS. 1A to 1D.

FIGS. 4A to 4G illustrate cross-sectional views showing a method of fabricating an image sensor according to some example embodiments of the present inventive concepts. Duplicate description of similar elements described above will be omitted below.

Figure 4A:
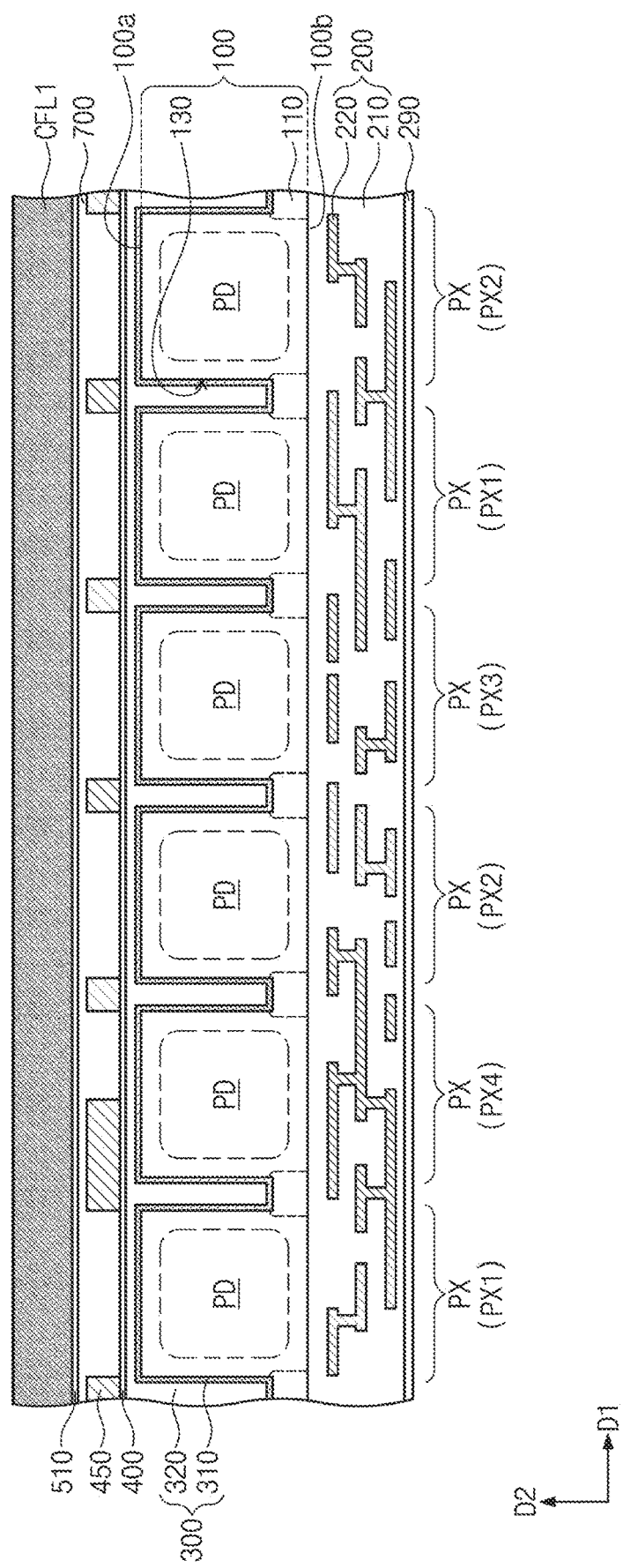
FIGS. 4A to 4G illustrate cross-sectional views showing a method of fabricating an image sensor according to some example embodiments.

Referring to FIG. 4A, the photoelectric conversion parts PD and the device isolation region 110 may be formed in the substrate 100. The connection line layer 200 and the passivation layer 290 may be formed on the second surface 100b of the substrate 100. The device isolation pattern 300, the adhesive layer 400, and the light-shielding pattern 450 may be formed on the first surface 100a of the substrate 100.

The planarization layer 700 may be formed on the first surface 100a of the first, second, third, and fourth pixel regions PX1, PX2, PX3, and PX4 of the substrate 100, on or covering the adhesive layer 400 and the light-shielding pattern 450. The planarization layer 700 may be annealed at temperatures between 200° C. and 300° C. The planarization layer 700 may have fluidity to flow during the annealing process. Thus, a top surface of the planarization layer 700 may become more planar.

The first adhesive pattern 510 may be formed on the top surface of the planarization layer 700, and may vertically overlap the first, second, third, and fourth pixel regions PX1, PX2, PX3, and PX4 of the substrate 100. The first adhesive pattern 510 may have a thickness of about 6 Å to about 100 Å.

The first color filter layer CFL1 may be formed on the first adhesive pattern 510. The first color filter layer CFL1 may vertically overlap the first, second, third, and fourth pixel regions PX1, PX2, PX3, and PX4 of the substrate 100.

Figure 4B:
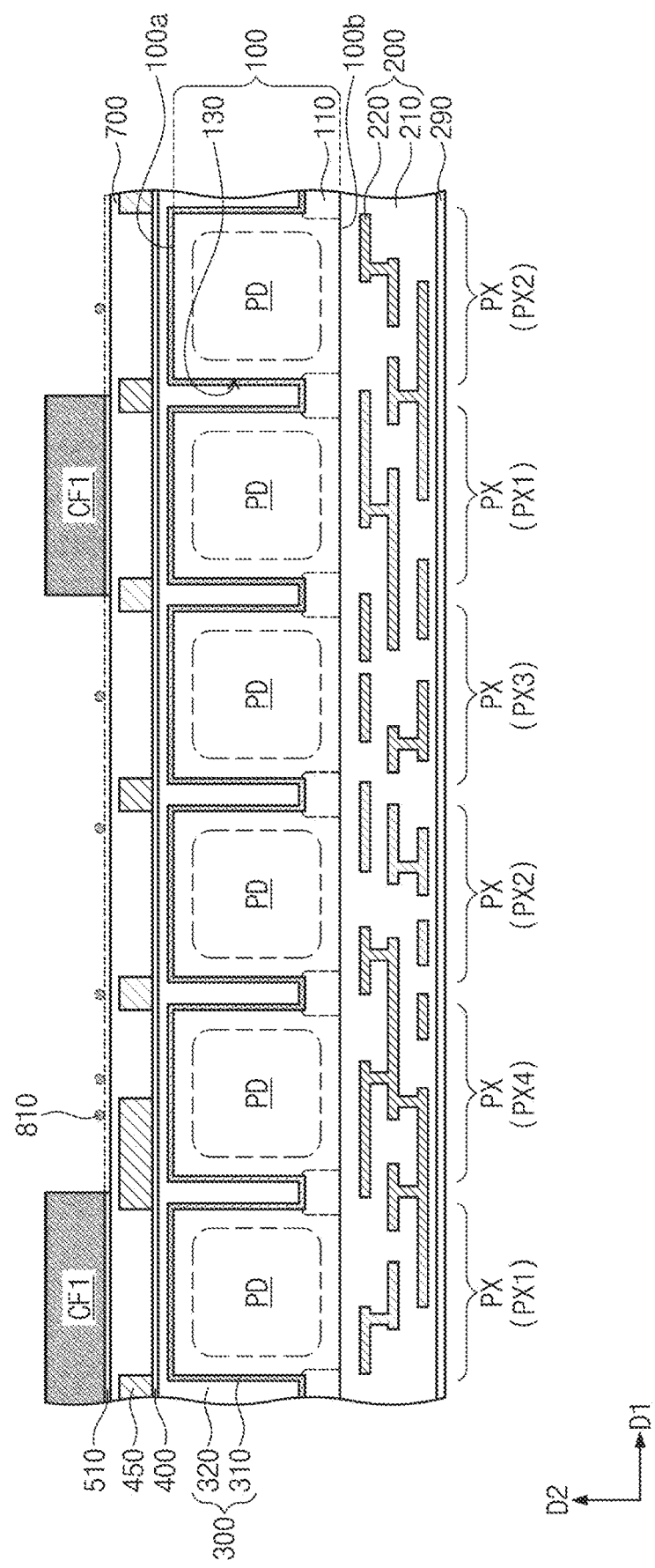

Referring to FIG. 4B, the first color filter layer CFL1 may be patterned to remove the first color filter layer CFL1 on the second, third, and fourth pixel regions PX2, PX3, and PX4. Therefore, the first color filter CF1 may be formed on the first adhesive pattern 510 of the first pixel region PX1. After the patterning of the first color filter layer CFL1, the first residues 810 may be formed on the first adhesive pattern 510 of the second, third, and fourth pixel regions PX2, PX3, and PX4.

A first etching process may be performed on the first color filter CF1 and the first adhesive pattern 510. The first etching process may be performed substantially the same as the first etching process discussed in FIGS. 2D and 2E. As illustrated by dotted line, the first etching process may remove the first residues 810 and the first adhesive pattern 510 on the second, third, and fourth pixel regions PX2, PX3, and PX4. The removal of the first residues 810 and the first adhesive pattern 510 may expose the planarization layer 700 on the second, third, and fourth pixel regions PX2, PX3, and PX4. The first etching process may reduce a height of the first color filter CF1. The first adhesive pattern 510 may remain between the planarization layer 700 and the first color filter CF1.

Figure 4C:
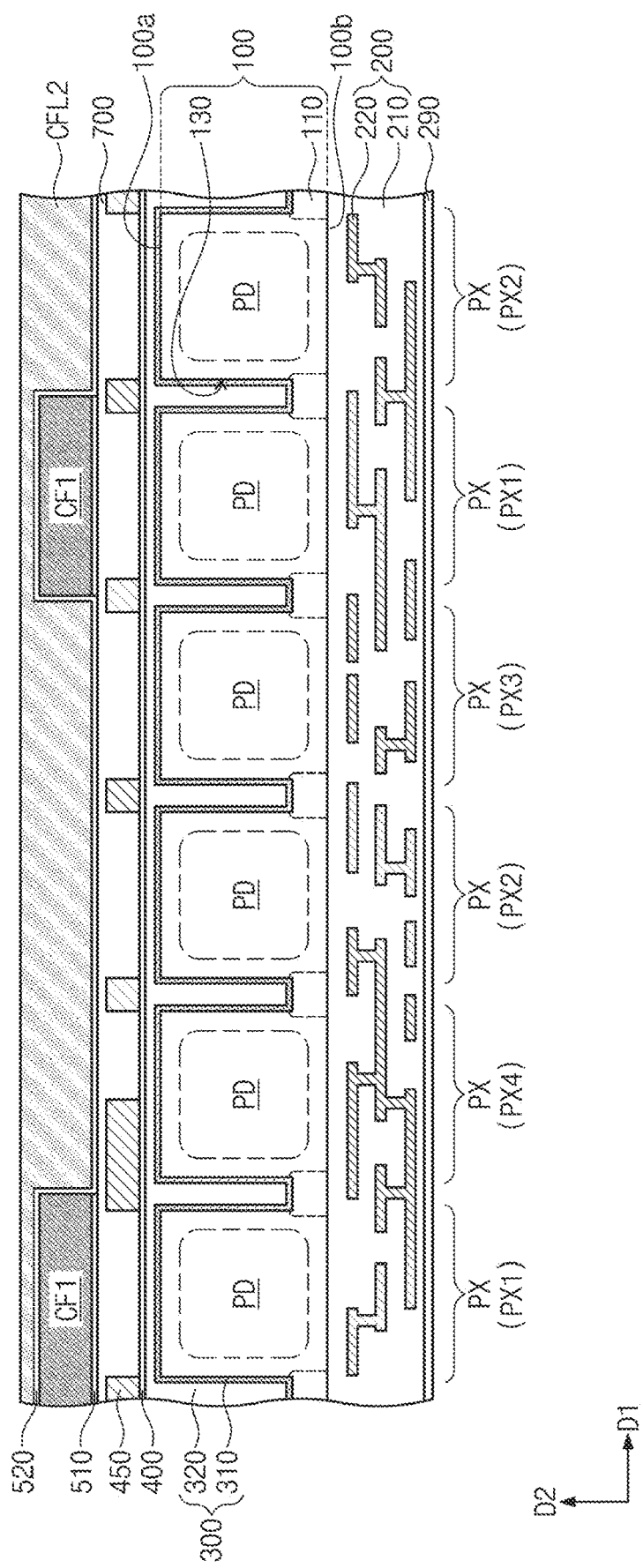

Referring to FIG. 4C, the second adhesive pattern 520 may be formed on the first surface 100a and on the first, second, third, and fourth pixel regions PX1, PX2, PX3, and PX4 of the substrate 100. The second adhesive pattern 520 may conformally cover top and lateral surfaces of the first color filter CF1 and may also conformally cover the exposed planarization layer 700. The second color filter layer CFL2 may be formed on the first surface 100a and on the first, second, third, and fourth pixel regions PX1, PX2, PX3, and PX4 of the substrate 100, on or covering the second adhesive pattern 520.

Figure 4D:
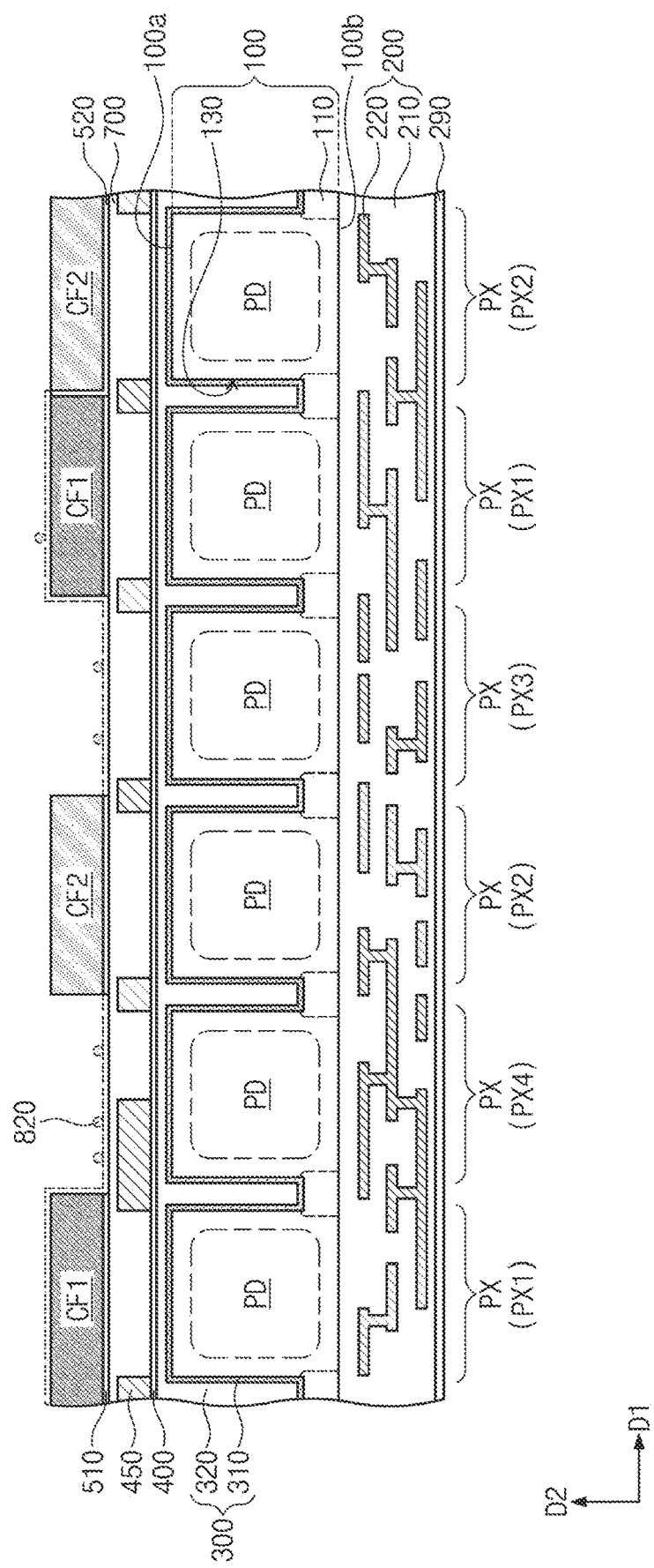

Referring to FIG. 4D, the second color filter layer CFL2 may be patterned to form the second color filter CF2 on the second pixel region PX2. The patterning of the second color filter layer CFL2 may expose the second adhesive pattern 520 on the first, third, and fourth pixel regions PX1, PX3, and PX4 of the substrate 100. After the patterning of the second color filter layer CFL2, the second residues 820 may remain on the second adhesive pattern 520.

A second etching process may be performed on the second color filter CF2 and the second adhesive pattern 520. The second etching process may be performed substantially the same as the second etching process discussed in FIGS. 2G and 2H. As illustrated by dotted line, the second etching process may remove the second residues 820 and the second adhesive pattern 520. The removal of the second residues 820 and the second adhesive pattern 520 may expose the first color filter CF1 and may also expose the planarization layer 700 on the third and fourth pixel regions PX3 and PX4. The second etching process may reduce a height of the second color filter CF2. The second adhesive pattern 520 may remain between the planarization layer 700 and the second color filter CF2. When the first and second pixel regions PX1 and PX2 neighbor each other, the second adhesive pattern 520 may further remain between corresponding first and second color filters CF1 and CF2.

Figure 4E:
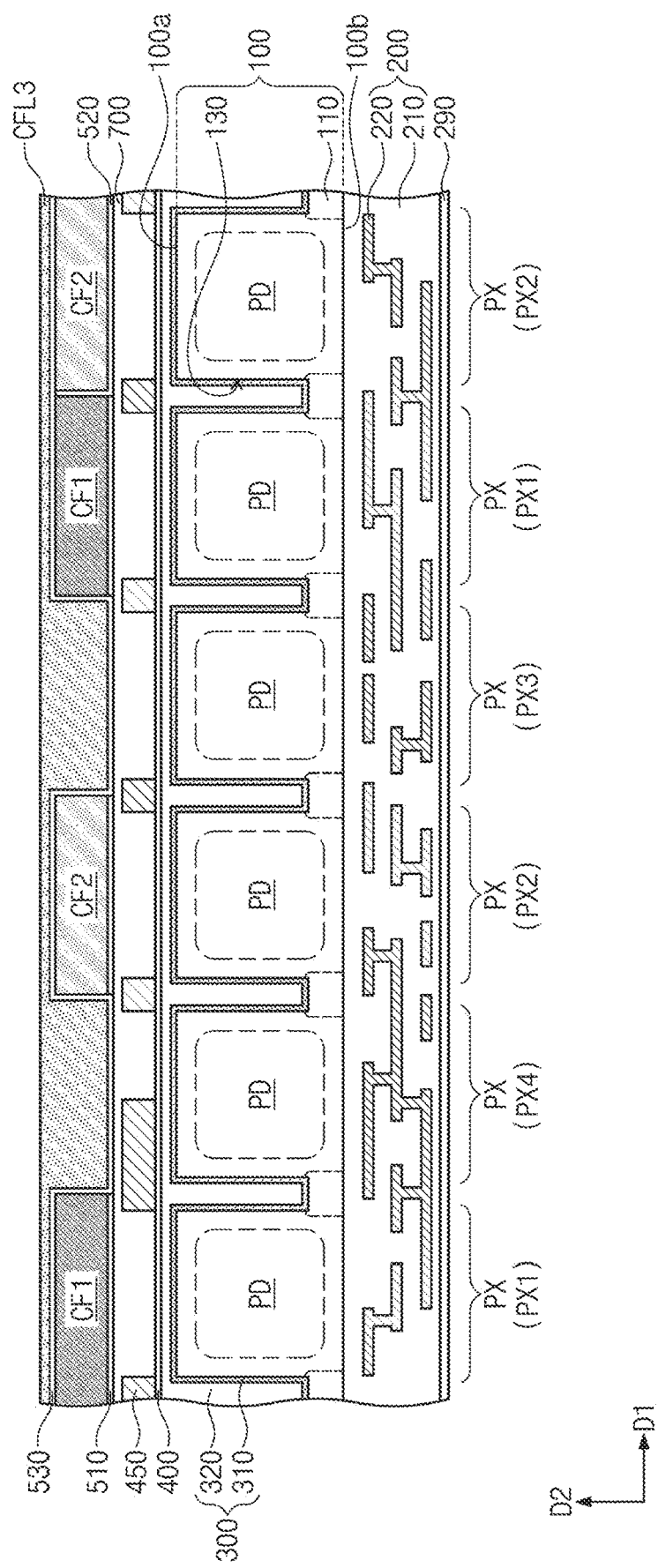

Referring to FIG. 4E, the third adhesive pattern 530 may be formed on the first surface 100a and on the first, second, third, and fourth pixel regions PX1, PX2, PX3, and PX4 of the substrate 100. The third adhesive pattern 530 may conformally cover top and lateral surfaces of the first color filter CF1, top and lateral surfaces of the second color filter CF2, and the exposed planarization layer 700 on the adhesive layer 400 in the third and fourth pixel regions PX3 and PX4. The third color filter layer CFL3 may be formed on the first, second, third, and fourth pixel regions PX1, PX2, PX3, and PX4 of the substrate 100, on or covering the third adhesive pattern 530.

Figure 4F:
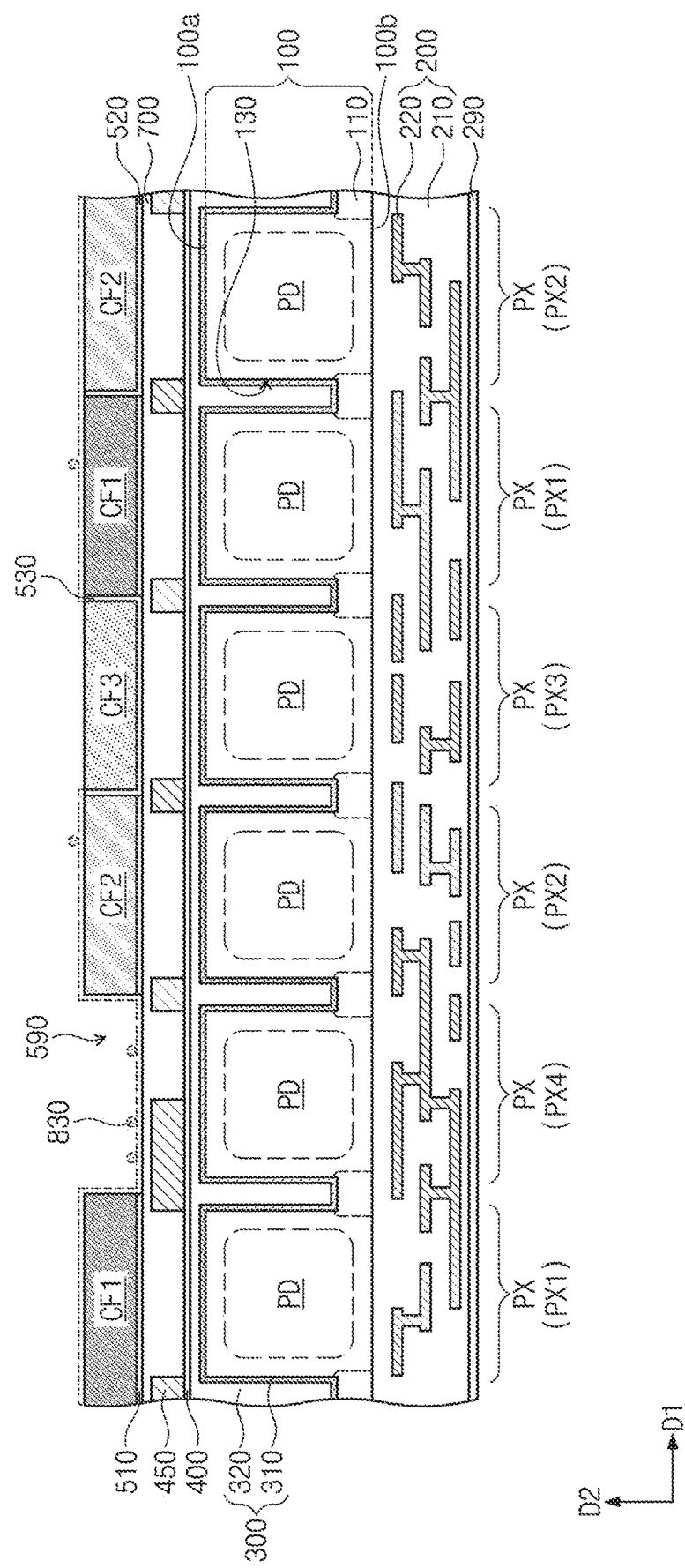

Referring to FIG. 4F, the third color filter layer CFL3 may be patterned to form the third color filter CF3 on the third pixel region PX3 of the substrate 100. The patterning of the third color filter layer CFL3 may expose the third adhesive pattern 530 on the first, second, and fourth pixel regions PX1, PX2, and PX4 of the substrate 100. After the patterning of the third color filter layer CFL3, the third residues 830 may remain on the third adhesive pattern 530.

A third etching process may be performed on the third color filter CF3 and the third adhesive pattern 530. The third etching process may be performed substantially the same as that discussed in FIGS. 2J and 2K. The third etching process may remove the third residues 830 and the exposed third adhesive pattern 530, as illustrated by dotted line. The removal of the third residues 830 and the third adhesive pattern 530 may expose the first color filter CF1 and the second color filter CF2, and may also expose the planarization layer 700 on the fourth pixel region PX4. The gap 590 may be formed between the first and second color filters CF1 and CF2. The third etching process may reduce a height of the third color filter CF3.

The third adhesive pattern 530 may remain between the planarization layer 700 and the third color filter CF3. The third adhesive pattern 530 may further remain between neighboring first and third color filters CF1 and CF3 and between neighboring second and third color filters CF2 and CF3.

Figure 4G:
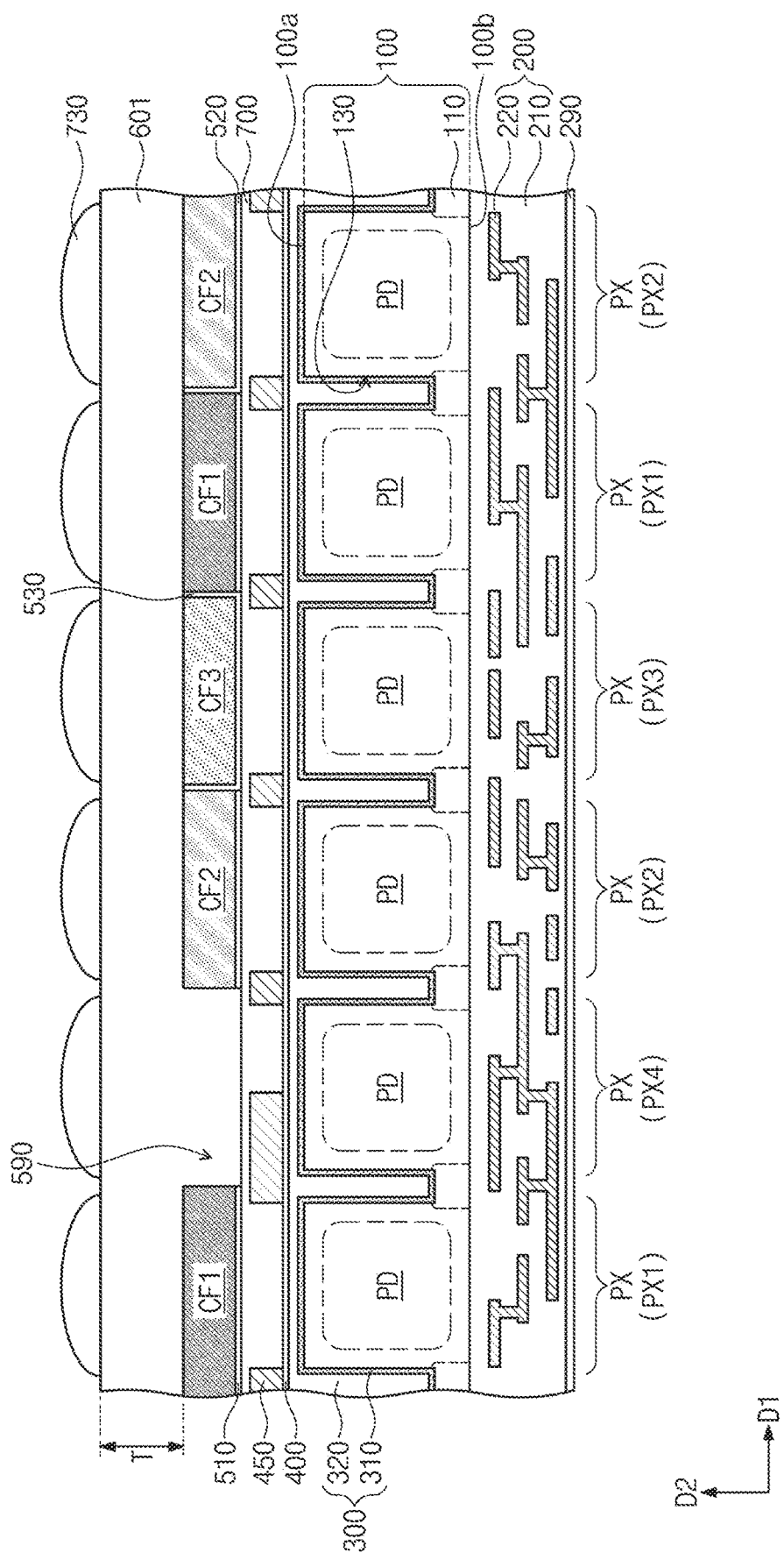

Referring to FIG. 4G, the preliminary lens layer 601 may be formed on the first surface 100a of the substrate 100, on or covering the top surfaces of the first, second, and third color filters CF1, CF2, and CF3. The preliminary lens layer 601 may extend to a location between the first and second color filters CF1 and CF2, and may fill the gap 590 between the first and second color filters CF1 and CF2. The preliminary lens layer 601 may directly contact the planarization layer 700 on the fourth pixel region PX4 of the substrate 100. In some embodiments, the preliminary lens layer 601 may have a thickness T of about 1.8 µm to about 3.5 µm.

The preliminary lens layer 601 may be annealed at temperatures between 200° C. and 300° C. Even though the top surface of the preliminary lens layer 601 is partially curved, the preliminary lens layer 601 may have fluidity during the annealing process and thus may have more planarized top surface.

The sacrificial lens patterns 730 may be formed on the preliminary lens layer 601. The fourth adhesive pattern 540 discussed in FIG. 2N may further be formed between the sacrificial lens patterns 730 and the preliminary lens layer 601.

Referring back to FIG. 3A, the sacrificial lens patterns 730 may undergo an etching process to from the micro-lens layer 600. The etching process may continue until the sacrificial lens patterns 730 are completely removed. The etching process may transfer shapes of the sacrificial lens patterns 730 onto the preliminary lens layer 601, forming the lens portions 630.

A sawing process may further be performed on the micro-lens layer 600, the device isolation pattern 300, the substrate 100, and the connection line layer 200. Thus, the wafer-level substrate 100 may be separated into chip-level substrates 100. Through the above-mentioned processes, an image sensor 2 may be eventually manufactured.

According to the present inventive concepts, a gap-fill portion of a micro-lens layer may extend to a location between sidewall or lateral surfaces of neighboring color filters and may fill a gap between the color filters on one of the pixel regions. The gap-fill portion of the micro-lens layer may serve as a fourth color filter. Therefore, the formation of the fourth color filter may be skipped or omitted to simplify the fabrication of an image sensor. The image sensor may have reduced striation defects and top surfaces of the color filters may be located at identical or similar level. As a result, the image sensor may exhibit improved image properties.

The detailed description of the present inventive concepts may be used in various other combinations, modifications, and environments without departing from the subject matter of the present inventive concepts.

What is claimed is:

1. An image sensor, comprising:
a substrate comprising a plurality of pixel regions;
a lower layer on the substrate;
a plurality of color filters on the lower layer, the plurality of color filters including a first color filter and a second color filter;
a first adhesive pattern between the lower layer and the first color filter;
a second adhesive pattern between the lower layer and the second color filter; and
a micro-lens layer on top surfaces of the color filters,
wherein the micro-lens layer extends between the first color filter and the second color filter, and between the first adhesive pattern and the second adhesive pattern, the micro-lens layer contacting the lower layer on one of the pixel regions,
wherein the second adhesive pattern is spaced apart from the first adhesive pattern, and
wherein the color filters are spaced apart from the lower layer.

2. The image sensor of claim 1, wherein the micro-lens layer comprises a gap-fill portion on the one of the pixel regions between the first color filter and the second color filter, and wherein the first adhesive pattern and the second adhesive pattern are not provided between the substrate and a bottom surface of the gap-fill portion.

3. The image sensor of claim 2, wherein the substrate comprises a plurality of photoelectric conversion parts in corresponding ones of the pixel regions, and in plan view, the gap-fill portion overlaps one of the photoelectric conversion parts in the one of the pixel regions.

4. The image sensor of claim 1, wherein the first adhesive pattern and the second adhesive pattern comprise an acryl-based polymer, and the lower layer comprises metal oxide.

5. The image sensor of claim 1, further comprising a light-shielding pattern on the substrate, wherein the lower layer is on the light-shielding pattern, and wherein the light-shielding pattern overlaps a portion of the one of the pixel regions in plan view.

6. An image sensor, comprising:
a substrate;
a first color filter on a first pixel region of the substrate;
a first adhesive pattern between the substrate and the first color filter;
a second color filter on a second pixel region of the substrate and laterally spaced apart from the first color filter on the first pixel region;
a second adhesive pattern disposed between the substrate and the second color filter and spaced apart from the first adhesive pattern; and a micro-lens layer on a top surface of the first color filter and a top surface of the second color filter, the micro-lens layer comprising a gap-fill portion between a sidewall surface of the first color filter and a sidewall surface of the second color filter on a third pixel region of the substrate, and wherein the first adhesive pattern and the second adhesive pattern are not provided between the substrate and a bottom surface of the gap-fill portion in the third pixel region.

7. The image sensor of claim 6, further comprising an adhesive layer between the substrate and the first adhesive pattern and between the substrate and the second color filter.

8. The image sensor of claim 7, wherein the gap-fill portion contacts the adhesive layer on the third pixel region.

9. The image sensor of claim 7, wherein the second adhesive pattern is between the adhesive layer and the second color filter, wherein the first pixel region is free of the second adhesive pattern and the second pixel region is free of the first adhesive pattern.

10. The image sensor of claim 7, wherein the adhesive layer comprises metal oxide, and the first adhesive pattern comprises an organic material.

11. The image sensor of claim 6, further comprising:
a third color filter on a fourth pixel region of the substrate and laterally spaced apart from the first and second color filters; and
a third adhesive pattern between the substrate and the third color filter.

12. The image sensor of claim 11, wherein the third adhesive pattern extends onto a sidewall surface of the third color filter and contacts one or more of the first and second color filters, and wherein the third adhesive pattern is not provided between the substrate and the bottom surface of the gap-fill portion in the fourth pixel region.

13. The image sensor of claim 6, wherein the substrate comprises a plurality of photoelectric conversion parts therein, and the photoelectric conversion parts comprise a first photoelectric conversion part in the third pixel region that overlaps the gap-fill portion, in plan view.

14. The image sensor of claim 13, further comprising a light-shielding pattern on the substrate, wherein the light-shielding pattern overlaps a portion of the first photoelectric conversion part, in plan view.

15. The image sensor of claim 6, further comprising a planarization layer between the substrate and the first adhesive pattern and between the substrate and the second color filter, wherein the gap-fill portion contacts the planarization layer on the third pixel region.

16. An image sensor, comprising:
a substrate comprising first, second, and third pixel regions;
an adhesive layer on the substrate;
a first color filter on the adhesive layer on the first pixel region;
a second color filter on the adhesive layer on the second pixel region and laterally spaced apart from the first color filter;
a first adhesive pattern between the adhesive layer and the first color filter in the first pixel region;
a second adhesive pattern disposed between the adhesive layer and the second color filter in the second pixel region and spaced apart from the first adhesive pattern; and
a micro-lens layer on a top surface of the first color filter and on a top surface of the second color filter, the micro-lens layer comprising a gap-fill portion that contacts the adhesive layer on the third pixel region and is between a sidewall surface of the first color filter and a sidewall surface of the second color filter,
wherein the gap-fill portion extends between the first adhesive pattern and the second adhesive pattern, and wherein the third pixel region is free of the first and second adhesive patterns.

17. The image sensor of claim 16, wherein the micro-lens layer comprises a plurality of lens patterns, and wherein the lens patterns comprise:
a first lens pattern that overlaps the first color filter and a first photoelectric conversion part in the first pixel region, in plan view;
a second lens pattern that overlaps the second color filter and a second photoelectric conversion part in the second pixel region, in plan view; and
a third lens pattern that overlaps the gap-fill portion and a third photoelectric conversion part in the third pixel region, in plan view.

18. The image sensor of claim 6, wherein the gap-fill portion extends between the first adhesive pattern and the second adhesive pattern.

* * * * *